(12) United States Patent
Luk et al.

(10) Patent No.: US 8,947,927 B2
(45) Date of Patent: Feb. 3, 2015

(54) GATED DIODE MEMORY CELLS

(75) Inventors: Wing K. Luk, Chappaqua, NY (US); Robert H. Dennard, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 12/512,559

(22) Filed: Jul. 30, 2009

(65) Prior Publication Data

US 2009/0285018 A1 Nov. 19, 2009

Related U.S. Application Data

(62) Division of application No. 10/735,061, filed on Dec. 11, 2003, now Pat. No. 8,445,946.

(51) Int. Cl.
*G11C 11/405* (2006.01)

(52) U.S. Cl.
CPC ..................................... *G11C 11/405* (2013.01)
USPC .............................. 365/175; 365/72; 365/150

(58) Field of Classification Search
USPC ............ 365/149, 175, 150, 72; 257/E29.195; 307/109–110, 112–118, 125–131, 307/139–143
See application file for complete search history.

(56) References Cited

U.S. PATENT DOCUMENTS

| | | | | |
|---|---|---|---|---|
| 3,513,365 A | * | 5/1970 | Levi | 257/296 |
| 3,706,891 A | * | 12/1972 | Donofrio et al. | 365/149 |
| 4,021,788 A | * | 5/1977 | Marr | 365/149 |
| 4,045,783 A | * | 8/1977 | Harland | 365/202 |
| 4,370,737 A | | 1/1983 | Chan | |
| 4,695,864 A | * | 9/1987 | Kawamoto | 257/297 |
| 5,278,785 A | | 1/1994 | Hazani | |
| 5,307,315 A | | 4/1994 | Oowaki et al. | |
| 5,434,816 A | * | 7/1995 | Levi | 365/189.03 |
| 5,600,598 A | * | 2/1997 | Skjaveland et al. | 365/189.11 |
| 5,703,806 A | * | 12/1997 | Puar et al. | 365/181 |
| 5,757,693 A | * | 5/1998 | Houghton et al. | 365/149 |
| 5,835,402 A | * | 11/1998 | Rao et al. | 365/149 |

(Continued)

FOREIGN PATENT DOCUMENTS

JP 2001093988 4/2001

OTHER PUBLICATIONS

Kim et al. "An Experimental High-Density DRAM Cell with a Built-in Gain Stage," Aug. 1994, IEEE Journal of Solid-State Circuits, vol. 29 No. 8 pp. 978-981.*

(Continued)

*Primary Examiner* — Harry W. Byrne
*Assistant Examiner* — Lance Reidlinger
(74) *Attorney, Agent, or Firm* — F. Chau & Associates, LLC

(57) ABSTRACT

A gated diode memory cell is provided, including one or more transistors, such as field effect transistors ("FETs"), and a gated diode in signal communication with the FETs such that the gate of the gated diode is in signal communication with the source of a first FET, wherein the gate of the gated diode forms one terminal of the storage cell and the source of the gated diode forms another terminal of the storage cell, the drain of the first FET being in signal communication with a bitline ("BL") and the gate of the first FET being in signal communication with a write wordline ("WLw"), and the source of the gated diode being in signal communication with a read wordline ("WLr").

17 Claims, 22 Drawing Sheets

(56) References Cited

U.S. PATENT DOCUMENTS

| | | |
|---|---|---|
| 5,841,690 A | 11/1998 | Shibutani et al. |
| 5,841,703 A | 11/1998 | Wojciechowski |
| 5,870,329 A * | 2/1999 | Foss .............................. 365/149 |
| 6,134,146 A | 10/2000 | Bill et al. |
| 6,314,017 B1 | 11/2001 | Emori et al. |
| 6,452,858 B1 * | 9/2002 | Hanzawa et al. ........ 365/230.06 |
| 6,468,855 B2 | 10/2002 | Leung et al. |
| 6,504,741 B2 * | 1/2003 | Ema ............................... 365/49.1 |
| 6,804,142 B2 * | 10/2004 | Forbes .......................... 365/149 |
| 6,870,229 B2 * | 3/2005 | Dessard et al. ............... 257/360 |
| 6,980,448 B2 | 12/2005 | Foss et al. |
| 2003/0147277 A1 * | 8/2003 | Hsu .......................... 365/185.01 |

OTHER PUBLICATIONS

Speckbacher et al., "The 'Gated-Diode' Configuration in MOSFET's, A sensitive Tool for Characterizing Hot-Carrier Degradation," IEEE Transations on Electron Devices, vol. 42 No. 7, Jul. 1995, pp. 1287-1291.*

English Abstract for Publication No. JP2001093988.

* cited by examiner

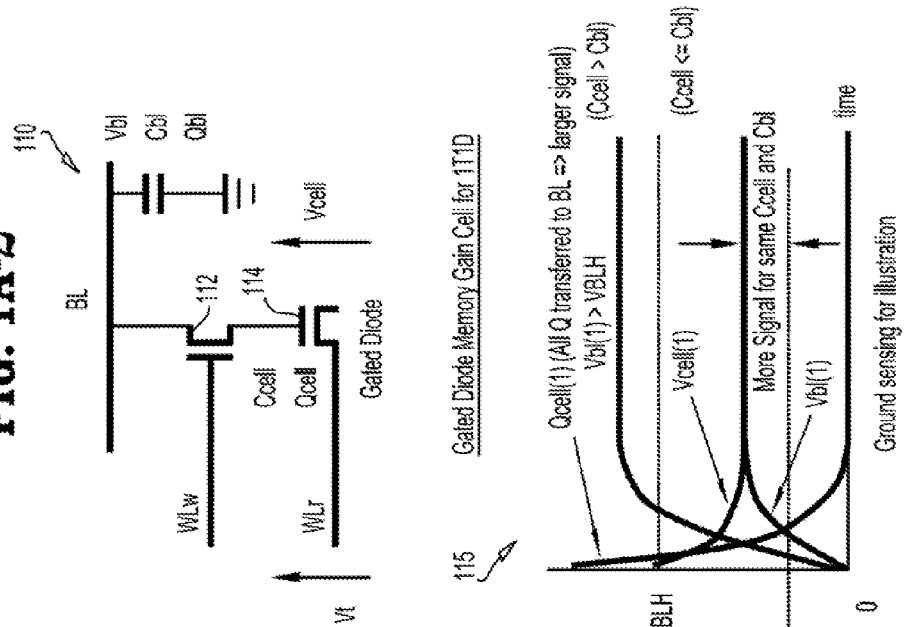
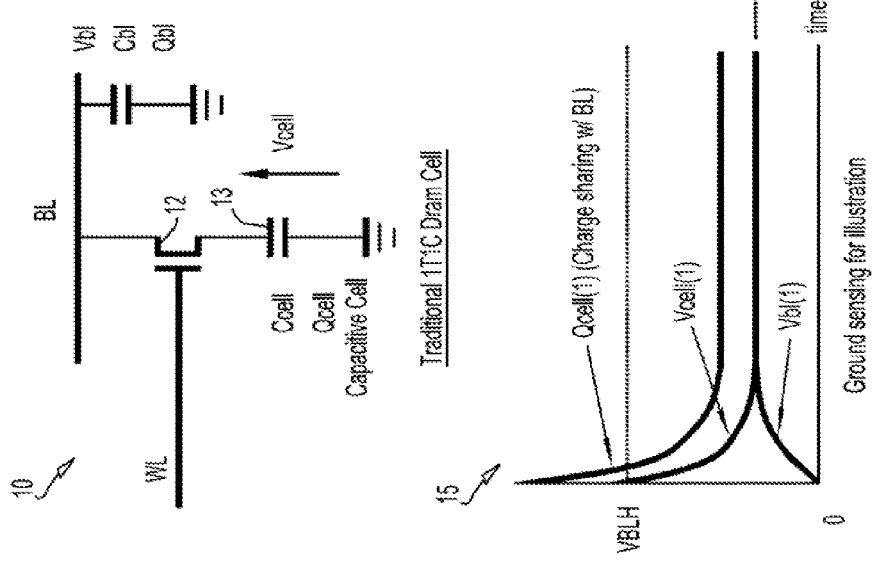

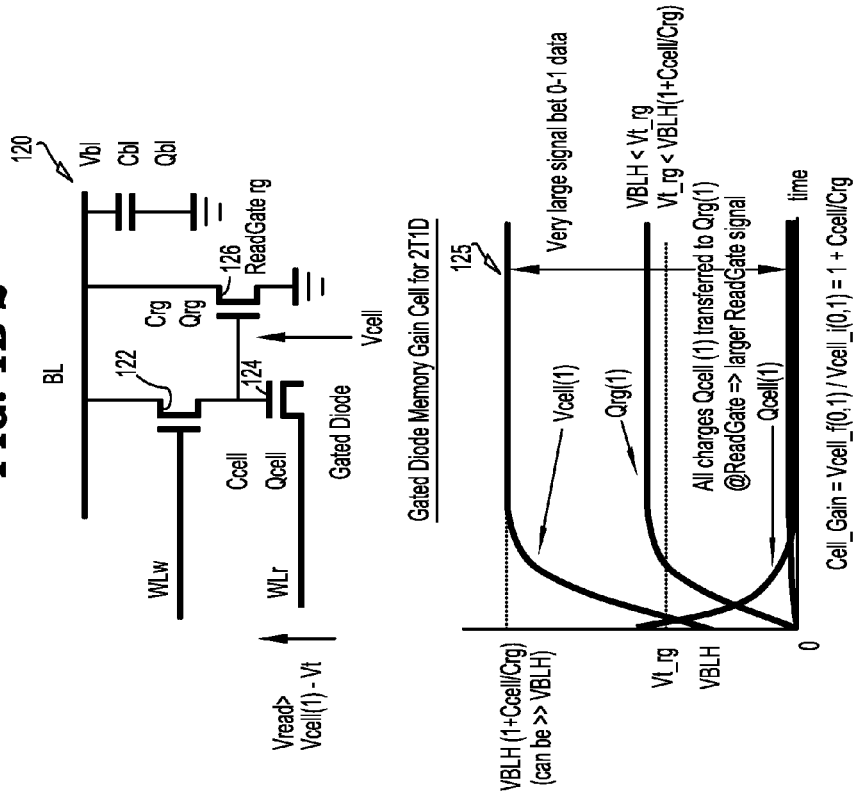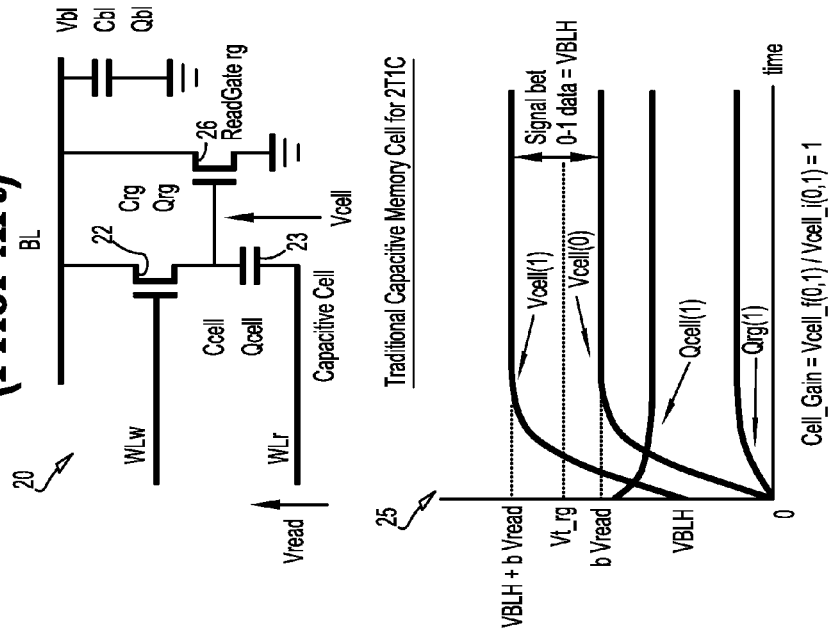

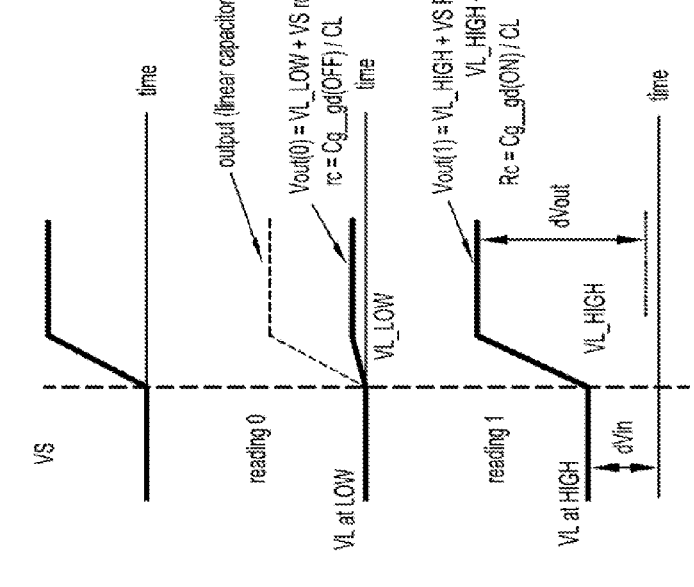
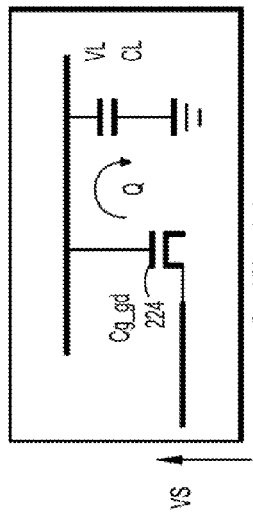
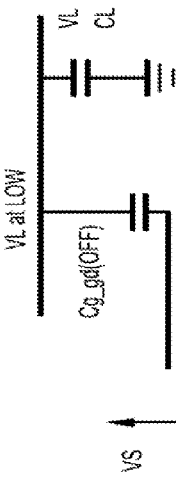
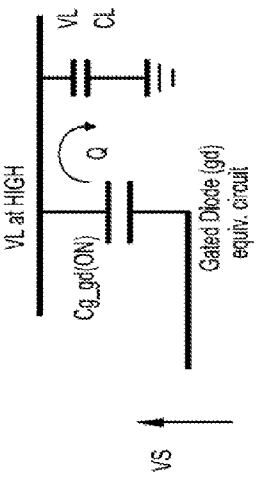
FIG. 2A-1 FIG. 2A-2 FIG. 2A-3 FIG. 2A-4

FIG. 2B-1

BLr — Cg_rg — Read Gate (rg)

224 Q — Cg_gd — Vg_f

Gated Diode Cell (gd)

210

@ Typical operating point
~700 mV overdrive for Read Gate
($Vt\_rg = 0.6$ V)
-10 – 20 x Qmin charge reserved in
Gate Diode for SER protection
$Cg\_rg = 0.2$ fF, $Cg\_gd = 2 + $ fF $Rc = Cg\_gd / Cg\_rg$
$Gain = Vg\_f / Vg\_i$ Gain = $1 + Rc - (Vt\_gd / Vg\_i) \, Rc \sim 1 + Rc$    complete charge transfer (for small Rc)
Gain = $(1 + Vs / Vg\_i) \, Rc / (1 + Rc)$    constrained charge transfer (large Rc)

$Vg\_i = 0.4$ V, $Vt\_gd = 0$ typical operating point

| Cg_gd / Cg_rg | 0.01 | 0.1 | 1 | 2 | 5 | 6 | 10 | 100 |
|---|---|---|---|---|---|---|---|---|
| 1 + Rc | 1.01 | 1.1 | 2 | 3 | 6 | 7 | 11 | 101 |
| Rc / (1 + Rc) | 0.01 | 0.09 | 0.5 | 0.67 | 0.83 | | 0.91 | 0.99 |
| Gain | 0.35 | 0.32 | 1.75 | 2.35 | 2.91 | | 3.19 | 3.47 |
| Gain | 0.04 | 0.36 | 2.00 | 2.68 | 3.32 | | 3.64 | 3.96 | $Vs / Vg = 2.5$ <br> $Vs / Vg = 3$ |
| Charge Transfer | <— complete —> | | | | <— constrained —> | | | |

$Gain = Vg\_f / Vg\_i$

@ Transition from complete to constrained
$Rc = (Vs + Vt\_gd - Vt\_rg) / (Vg\_i - Vt\_gd)$
e.g. $Vs = 1$V, $Vg\_i = 0.4$V, $Vt\_rg = 0.6$V, $Vt\_gd = 0$
$Rc = 1$ complete charge transfer constrained charge transfer operating point $Vs / Vg\_i = 2, 3, 4, ...$ $Rc = Cg\_gd / Cg\_rd$

FIG. 2B-2

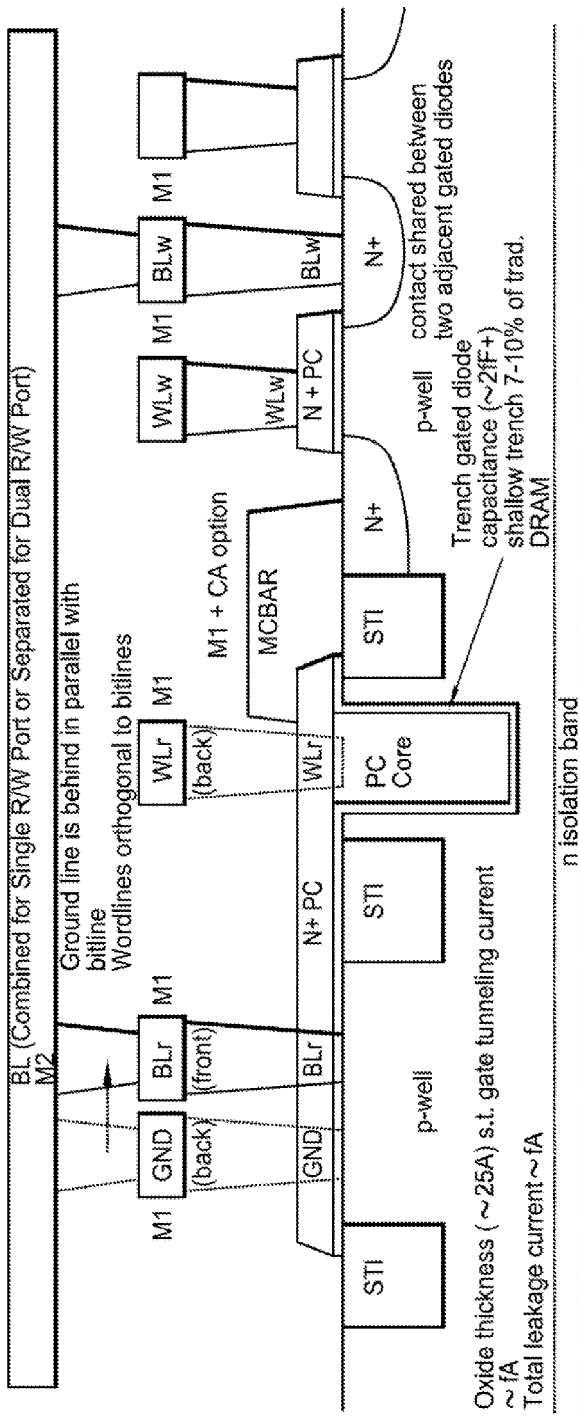

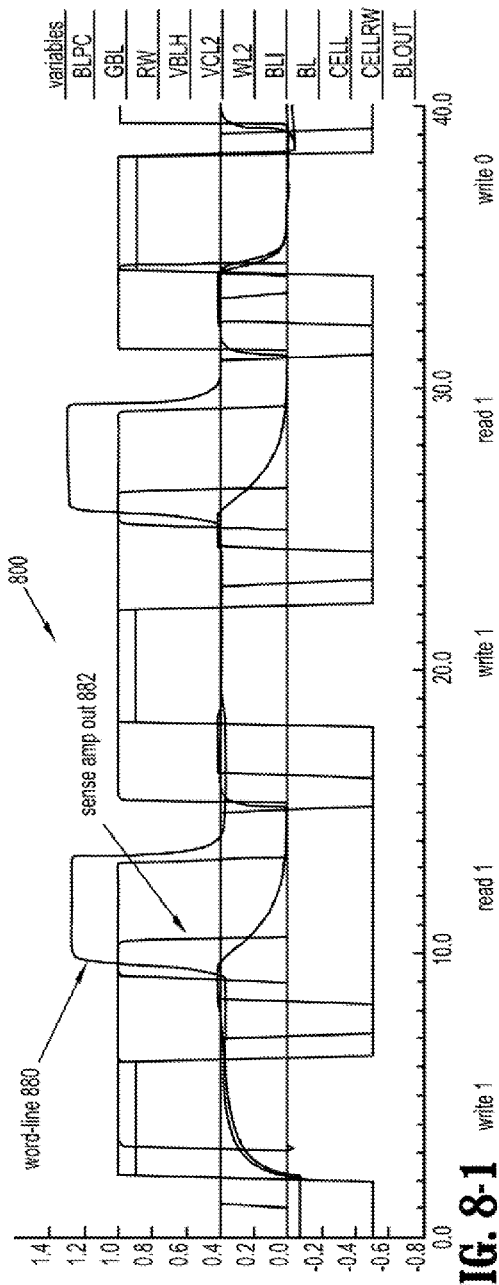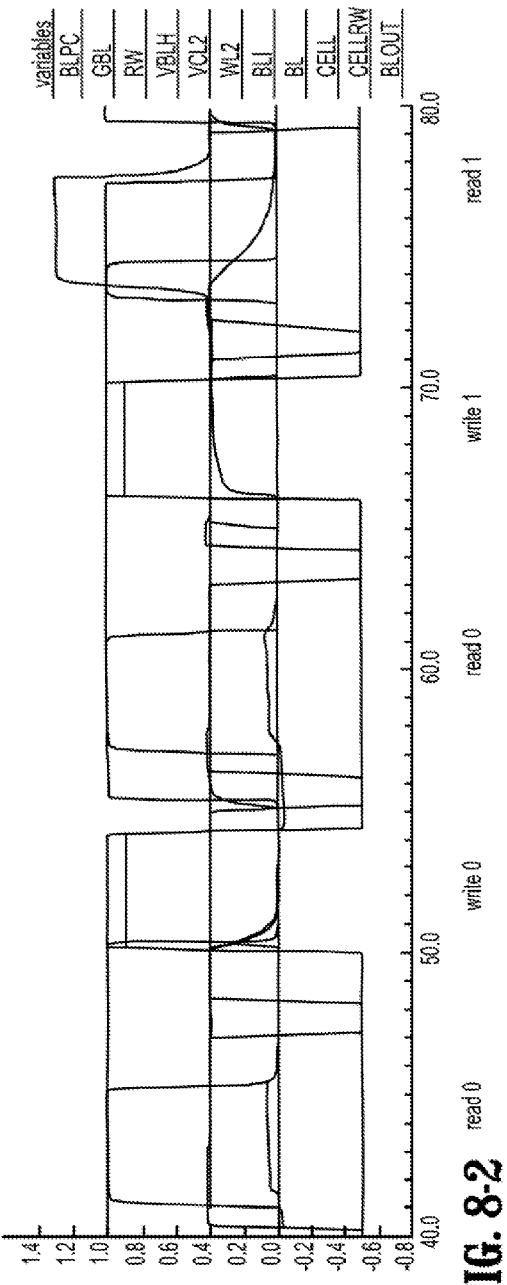
FIG. 8-1
FIG. 8-2

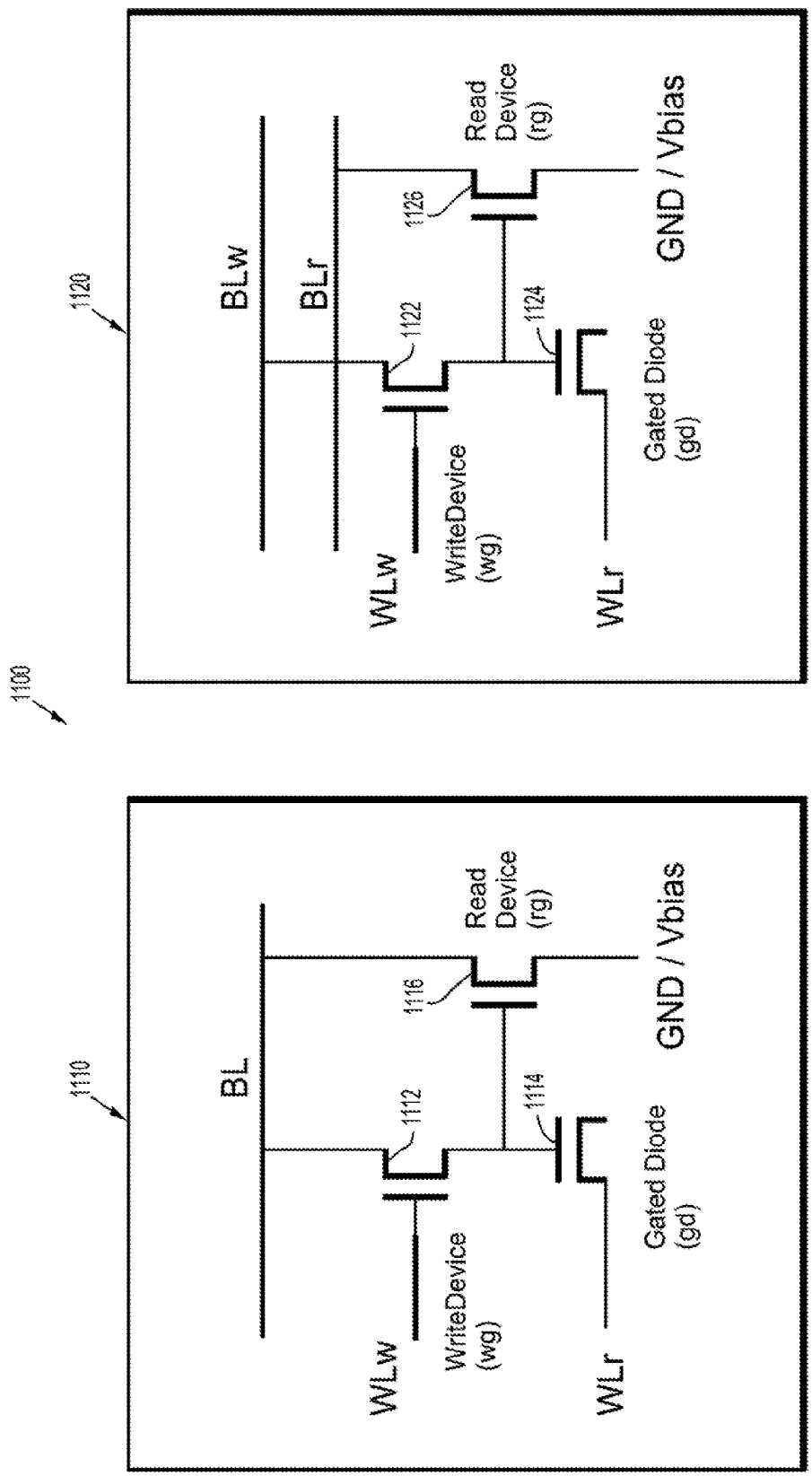

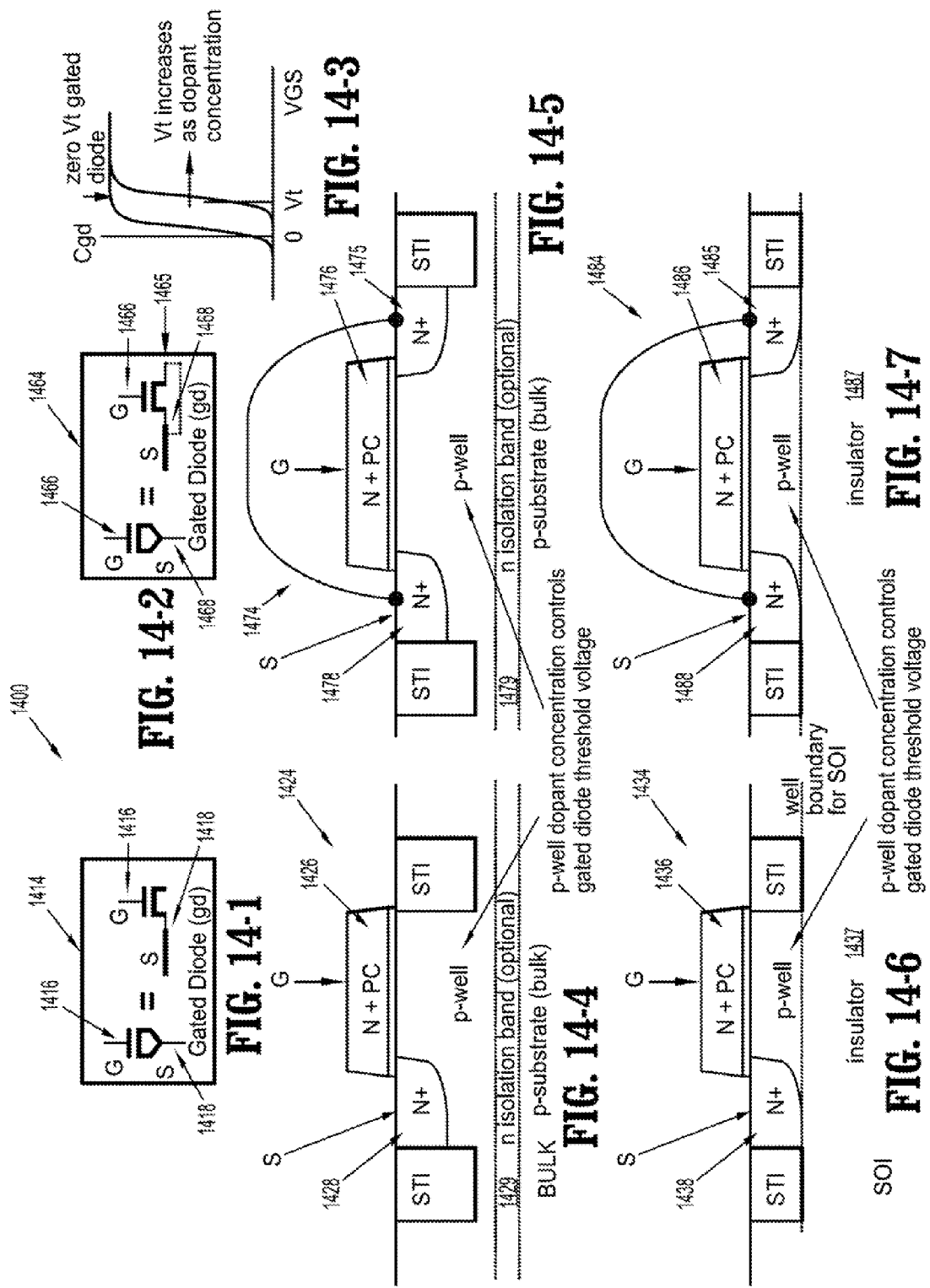

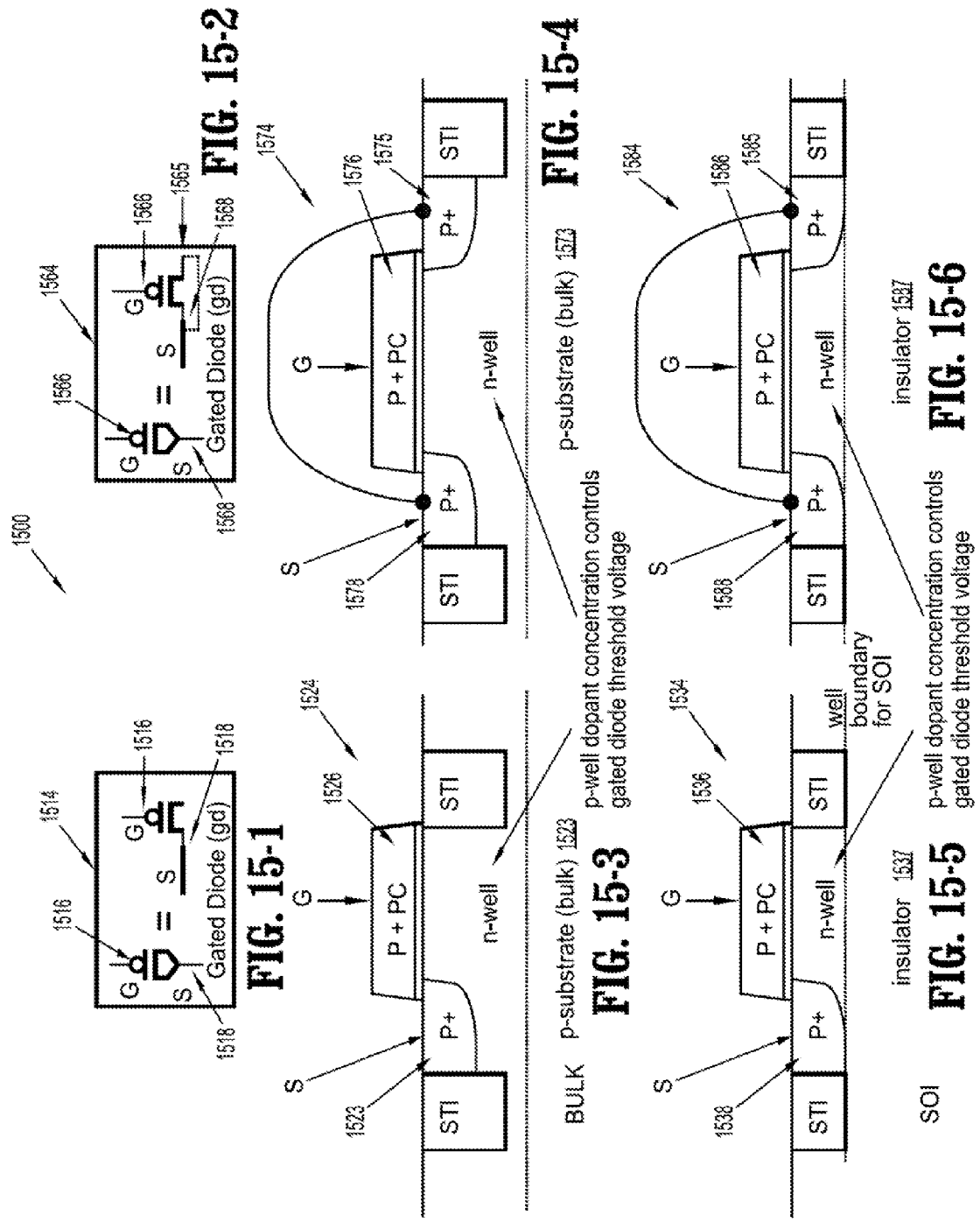

GATED DIODE MEMORY CELLS

CROSS-REFERENCE TO RELATED APPLICATION

This is a Divisional Application of U.S. application Ser. No. 10/735,061 filed on Dec. 11, 2003, now U.S. Pat. No. 8,445,946 the disclosure of which is herein incorporated by reference in its entirety.

BACKGROUND

The present disclosure relates to dynamic random access memory ("DRAM") and, more particularly, to memory cells and architectures with improved charging capabilities.

As shown in FIG. 1A, a conventional one-transistor one-capacitor ("1T1C") DRAM cell is indicated generally by the reference numeral 10. The 1T1C DRAM cell 10 includes a transistor 12 in signal communication with a capacitor 13. A corresponding plot of memory cell voltage ("V_cell") versus time is indicated generally by the reference numeral 15. During a Read operation, when a memory cell is Read and connected to the bitline ("BL"), the charges are shared between the cell and the BL or discharged to the BL, and subsequently the steady-state cell voltage, which is the same as the BL voltage, is equal after signal development to the voltage stored in the cell, V_cell (C_cell/(C_cell+C_bl)).

A voltage V_cell(1) is stored in the cell for a 1-data, while a voltage V_cell(0) of about 0 volts is stored in the cell for a 0-data. Here, assuming that the BL is precharged to 0 before the Read operation, other precharge voltages can be considered similarly. The ratio C_cell/(C_cell+C_bl) is known as the transfer ratio ("TR"), and it is less than 1. This means that there is a voltage drop in the cell during a Read operation. The gain of the cell measured by the ratio of the difference between V_cell(0) and V_cell(1) at sensing and before the Read operation is C_cell/(C_cell+C_bl), so Cell_Gain<1. In addition, a write-back operation is needed after the Read to restore the cell voltage to the pre-read level.

Thus, for a conventional 1T1C DRAM cell:

$$V\_cell\_initial(0, 1) = V\_cell\_initial(1) - V\_cell\_initial(0)$$
$$= VBLH - 0$$
$$= VBLH$$

$$V\_cell\_final(0, 1) = V\_cell\_final(1) - V\_cell\_final(0)$$
$$= VBLH \, C\_cell/(C\_cell + C\_bl) - 0$$
$$= VBLH \, C\_cell/(C\_cell + C\_bl)$$

$$Cell\_Gain = V\_cell\_final(0, 1)/V\_cell\_initial(0, 1)$$
$$= TR \, (\text{Transfer Ratio})$$
$$= C\_cell/(C\_cell + C\_bl) < 1$$

Turning to FIG. 1B, a conventional two-transistor one-capacitor ("2T1C") DRAM cell is indicated generally by the reference numeral 20. The 2T1C DRAM cell 20 includes a first transistor 22 in signal communication with a capacitor 23 and a second transistor 26. A corresponding plot of V_cell versus time is indicated generally by the reference numeral 25. During a Read operation, the cell is connected to the FET gate of the read device so as to develop a source to drain current on the BL for sensing, depending on the cell voltage being a 0 or High for 0- or 1-data. The cell voltage remains the same during the Read operation such that a write-back is not needed after the Read. The gain measured by the ratio of the differences between V_cell(0) and V_cell(1) at sensing and before the Read operation is 1, since the cell voltage remains the same regardless of the data being a 0 or 1, so Cell_Gain=1.

Thus, for a conventional 2T1C DRAM cell:

$$V\_cell\_initial(0, 1) = V\_cell\_initial(1) - V\_cell\_initial(0)$$
$$= VBLH - 0$$
$$= VBLH$$

$$V\_cell\_final(0, 1) = V\_cell\_final(1) - V\_cell\_final(0)$$
$$= VBLH - 0$$
$$= VBLH$$

$$Cell\_Gain = V\_cell\_final(0, 1)/V\_cell\_initial(0, 1)$$
$$= 1$$

Accordingly, what is needed over a conventional 1T1C DRAM is a new memory cell that can (1) boost the Cell_Gain higher for the same amount of cell and bitline capacitance compared to the conventional 1T1C case, or (2) boost the Cell_Gain to greater than 1, which cannot be achieved with a conventional 1T1C DRAM.

In addition, what is needed over a conventional 2T1C DRAM is a new memory cell that can boost the Cell_Gain higher to always greater than 1 while achieving a signal about an order of magnitude greater than the conventional 2T1C case.

SUMMARY

These and other drawbacks and disadvantages of the prior art are addressed by gated diode memory cells and architectures in accordance with embodiments of the present disclosure.

A gated diode memory cell is provided, including one or more transistors, such as field effect transistors ("FETs"), and a gated diode in signal communication with the FETs such that the gate of the gated diode is in signal communication with the source of a first FET, wherein the gate of the gated diode forms one terminal of the storage cell and the source of the gated diode forms another terminal of the storage cell, the drain of the first FET being in signal communication with a bitline ("BL") and the gate of the first FET being in signal communication with a write wordline ("WLw"), and the source of the gated diode being in signal communication with a read wordline ("WLr").

These and other aspects, features and advantages of the present disclosure will become apparent from the following description of exemplary embodiments, which is to be read in connection with the accompanying drawings.

BRIEF DESCRIPTION OF THE DRAWINGS

The present disclosure provides one-transistor one-diode ("1T1D") and two-transistor one-diode ("2T1D") memory cells and architectures in accordance with the following exemplary figures, in which:

FIG. 1A-1, FIG. 1A-2, FIG. 1A-3, and FIG. 1A-4 show comparative schematic and graphical diagrams of a conventional memory cell for a 1T1C DRAM as well as of a Gated Diode Memory Cell for a 1T1D DRAM according to an embodiment of the present disclosure;

FIG. 1B-1, FIG. 1B-2, FIG. 1B-3, and FIG. 1B-4 show comparative schematic and graphical diagrams of a conventional memory cell for a 2T1C DRAM as well as of a Gated Diode Memory Cell for a 2T1D DRAM according to an embodiment of the present disclosure;

FIG. 2A-1, FIG. 2A-2, FIG. 2A-3, and FIG. 2A-4 show schematic and graphical diagrams of a Gated Diode Signal Amplifier (plus Storage) according to an embodiment of the present disclosure;

FIG. 2B-1 and FIG. 2B-2 show schematic and graphical diagrams of a portion of a 2T1D Gated Diode Memory Cell according to an embodiment of the present disclosure;

FIG. 2C-1 and FIG. 2C-2 show schematic and graphical diagrams of a 2T1D Gated Diode Memory Cell according to an embodiment of the present disclosure;

FIG. 3A-1 and FIG. 3A-2 show schematic and cross-sectional diagrams of a Single/Dual R/W Port 2T1D Memory Cell embodiment using metal connectors where the gated diode is implemented in the form of a trench;

FIG. 3B-1, FIG. 3B-2, and FIG. 3B-3 show schematic and cross-sectional diagrams of a Single/Dual R/W Port 2T1D Memory Cell embodiment using alternate connectors where the gated diode is implemented in the form of a trench;

FIG. 4-1 and FIG. 4-2 show schematic and cross-sectional diagrams of a Single/Dual R/W Port 2T1D Memory Cell embodiment where the gated diode is implemented using planar silicon on insulator ("SOI") technology;

FIG. 5-1 and FIG. 5-2 show schematic and cross-sectional diagrams of a Single/Dual R/W Port 2T1D Memory Cell embodiment where the gated diode is implemented using planar bulk silicon technology, with an optional n-isolation band to isolate the p-well;

FIG. 8-1 and FIG. 8-2 show a graphical diagram of the resulting simulation waveforms of a Planar or Trench 2T1D Memory Cell embodiment;

FIG. 11A-1 and FIG. 11A-2 show a schematic diagram of a 2T1D Memory Cell with Ground or Vbias embodiment;

FIG. 13-1 and FIG. 13-2 show graphical diagrams with simulation waveforms of the 2T1D Dual R/W Port Array embodiment of FIG. 10;

FIG. 14-1, FIG. 14-2, FIG. 14-3, FIG. 14-4, FIG. 14-5, FIG. 14-6, and FIG. 14-7 show a schematic diagram of an exemplary n-type Gated Diode Planar Structure in Bulk Silicon/SOI;

FIG. 15-1, FIG. 15-2, FIG. 15-3, FIG. 15-4, FIG. 15-5, and FIG. 15-6 show a schematic diagram of an exemplary p-type Gated Diode Planar Structure in Bulk Silicon/SOI;

FIG. 16-1 and FIG. 16-2 show a schematic diagram of another exemplary 2T1D Gated Diode Planar Memory Cell Structure with Single/Dual R/W Port in planar silicon on insulator (SOI) technology; and FIG. 17-1 and FIG. 17-2 show a schematic diagram of another exemplary 2T1D Gated Diode Planar Memory Cell Structure with Single/Dual R/W Port in planar bulk silicon technology, with an optional n-isolation band to isolate the p-well.

DETAILED DESCRIPTION OF PREFERRED EMBODIMENTS

Figures 1, 2C:
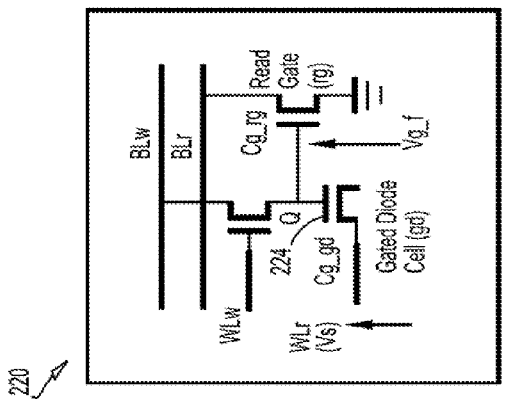
Figures 2, 2C:
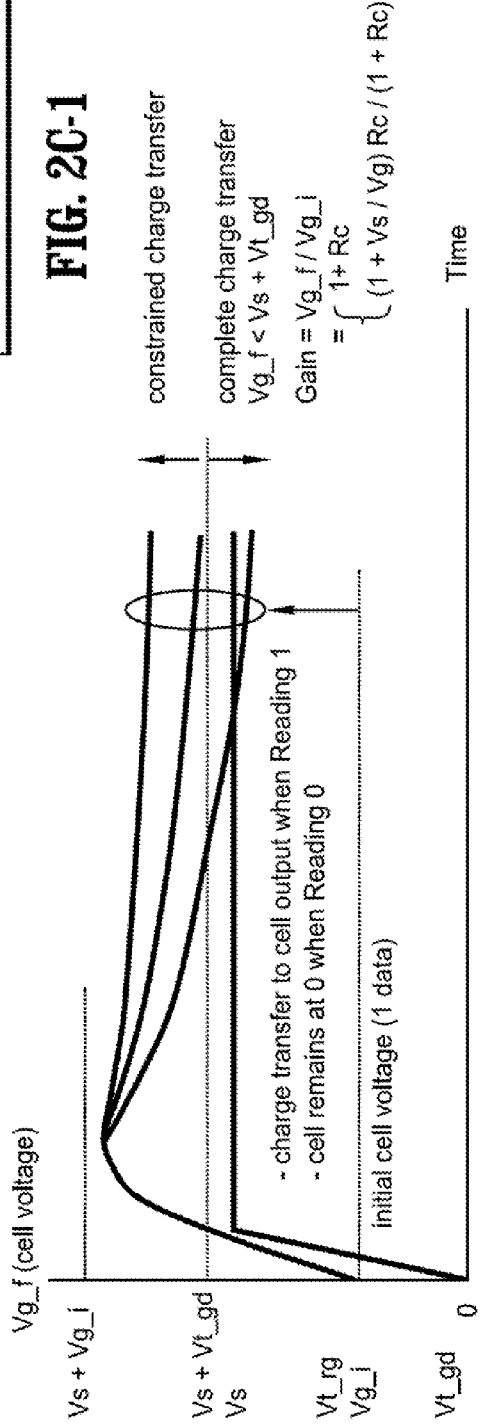

Traditionally, dynamic memory cells based on capacitors have exhibited voltage drops (such as 1T1C), or at best, a holding equal (such as 2T1C) during Read operations. A new memory cell is provided where the cell voltage can be increased during a Read operation, thereby significantly improving the sensing signal, sensing signal-to-noise ratio and sensing speed for dynamic memories built with cell structures according to the present disclosure. In the description that follows, the term "storage cell" refers to the gated diode, and the term "memory cell" refers to the whole 1T1D or the whole 2T1D device. The terms "implementing FET for the gated diode", "gated diode implementing FET" or simply "gated diode FET" may be used interchangeably.

As shown in FIG. 1A, a Gated Diode Memory Gain Cell for a one-transistor one-diode ("1T1D") DRAM cell is indicated generally by the reference numeral 110. The 1T1D DRAM cell 110 includes a transistor 112 in signal communication with a gated diode 114. A corresponding plot of V_cell versus time is indicated generally by the reference numeral 115. A comparison of the cell 110 with the cell 10, previously introduced in the Background section, highlights the following differences:

|  | Traditional 1T1C DRAMCell | Gated Diode Memory Gain Cell for 1T1D |
|---|---|---|
| Vcell_i(0, 1) | 0~VBLH | 0~VBLH |
| Vbl_f(0, 1) | 0~VBLH Ccell/ (Ccell + Cbl) < VBLH | VBLH Ccell/Cbl (can be > VBLH, super-boost) |
| Gain = Vbl_f(0, 1)/ Vcell_i(0, 1) | Ccell/(Ccell + Cbl) < 1 | Ccell/Cbl (can be > 1) |

Better signal and gain for 1T1D Gated Diode Memory Cell, improvement = 1 + Ccell/Cbl Turning to FIG. 1B, a Gated Diode Memory Gain Cell for two-transistor one-diode ("2T1D") DRAM cell is indicated generally by the reference numeral 120. The 2T1D DRAM cell 120 includes a first transistor 122 in signal communication with a gated diode 124 and a second transistor 126. A corresponding plot of V_cell versus time is indicated generally by the reference numeral 125. A comparison of the cell 120 with the cell 20, previously introduced in the Background section, highlights the following differences:

|  | Traditional 2T1C Cell | Traditional 3T1C Cell | Gated Diode Memory Gain Cell |
|---|---|---|---|
| Charge Transfer | 0 | 0 | VBLH Ccell |
| VBoost at ReadGate(0, 1) | Vread, Vread | 0, 0 | 0, VBLH Ccell/Crg |
| Vcell_i(0, 1) | 0, VBLH | 0, VBLH | 0, VBLH |
| Vcell_f(0, 1) | Vread b, VBLH + b Vread b = Ccell/(Ccell + Crg) | 0, VBLH | 0, VBLH(1 + Ccell/Crg) (>VBLH) |
| Gain = Vcell_f(0, 1)/ Vcell_i(0-1) | 1 | 1 | 1 + Ccell/Crg (>1) |

Better read_gate signal and gain for gated diode memory cell, improvement = 1 + Ccell/Crg (can be >> 1)

As shown in FIG. 2A, a Gated Diode Signal Amplifier (plus Storage) is indicated generally by the reference numeral 200 for illustration of the basic principle. The Gated Diode Signal Amplifier 200 includes a gated diode 224 and has the following features and characteristics:

Gated Diode High Gain Signal Enhancement
Non-Linear Voltage Boosting
Charge Transfer
Let
VL_HIGH be the magnitude of the High signal put onto the gated diode,
VL_LOW be the magnitude of the Low signal put onto the gated diode, VL_LOW is usually about 0,
Rc=Cg_gd(ON)/CL when VL is at VL_HIGH,
rc=Cg_gd(OFF)/CL when VL is at VL_LOW,
VS be the magnitude of the boosting voltage applied to the source of the gated diode,
dVin be the difference of the input signal between 0 and 1 (at the gate of the gated diode),
dVout be the difference of the output signal between 0 and 1 (at the gate of the gated diode) with signal amplification controlled by the boosting signal VS.

$$dVout=VL\_HIGH+VS\ Rc/(1+Rc)-(VS\ rc/(1+rc)+VL\_LOW)$$

$$dVin=VL\_HIGH-VL\_LOW$$

$$Gain=dVout/dVin\sim 1+VS/VL\_HIGH$$

Typically, $$Cg\_gd(ON)>>CL>>Cg\_gd(OFF)$$

$$Cg\_gd(OFF):CL:Cg\_gd(ON)=1:10:100$$

$$Rc>>1>>rc$$

$$VL\_LOW\sim 0$$

Typically, VS=1.2 V, VL_HIGH=0.4, VL_LOW=0
Gain=4 using Gated Diode
Gain=1 using linear capacitor Turning to FIG. 2B, a Schematic and Principle of Operation of the 2T1D Gated Diode Memory Cell is indicated generally by the reference numeral 210. The Gated Diode Memory Cell 210 includes a gated diode 224. A portion of a 2T1D gated diode memory cell is shown to illustrate the charge transfer mechanism during a read operation.

Turning now to FIG. 2C, a Schematic and Principle of Operation of the 2T1D Gated Diode Memory Cell is indicated generally by the reference numeral 220. The 2T1D Gated Diode Memory Cell 220 includes a gated diode 224 and exhibits the following characteristics:

Let
Vg_i be the initial voltage at the gate of the gated diode,
Vg_f be the final voltage at the gate of the gated diode,
Vt_gd be the threshold voltage of the gated diode (Vt_gd can be zero Vt or low Vt or regular Vt),
Vs be the boosting voltage applied to the source of the gated diode,
Cg_gd be the gate to source capacitance of the gated diode (gd),
Cg_rg be the gate to source capacitance of the read device (rg).

There are two modes of operation when a gated diode memory is read, namely, Complete Charge Transfer where all the charges in the gated diode are transferred out, and Constrained Charge Transfer. The gain for each of them is derived as follows.

$$Rc=Cg\_gd/Cg\_rg$$

$$Q\_stored=(Vg\_i-Vt\_gd)Cg\_gd$$

1. Complete charge transfer (Vg_f<=Vs+Vt_gd)

$$Q\_transfer=(Vg\_f-Vt\_rg)Cg\_rg=Q\_stored$$

$$Vg\_f=Q\_stored/Cg\_rg+Vt\_rg=(Vg\_i-Vt\_gd)Cg\_gd/Cg\_rg+Vt\_rg$$

$$Vg\_f=Vg\_i\ Rc+Vt\_rg-Vt\_gd\ Rc$$

$$Gain=Vg\_f/Vg\_i\sim 1+Rc\ (Vt\_rg>Vg\_i,Vt\_gd\ and\ Rc\ are\ small)$$

At maximal charge transfer, Vg_f=Vs+Vg_gd, $$Rc=(Vs+Vt\_gd-Vt\_rg)/(Vg\_i-Vt\_gd)$$

2. Constrained charge transfer (Vg_f>Vs+Vt_gd)

$$Q\_transfer1\ (up\ to\ Vs+Vt\_gd)=(Vs+Vt\_gd-Vt\_rg)Cg\_rg\ (charging\ up\ Cg\_rg)$$

$$Q\_transfer2\ (above\ Vs+Vt\_gd)=Q\_stored-Q\_transfer1\ (charging\ up\ Cg\_gd+Cg\_rg)$$

$$del\_V1=Vs+Vt\_gd-Vt\_rg$$

$$del\_V2=Q\_transfer2/(Cg\_gd+Cg\_rg)$$

$$Vg\_f=Vt\_rg+del\_V1+del\_V2=(Vs+Vg\_i)Rc/(1+Rc)+Vt\_rg/(1+Rc)-Vt\_gd$$

$$Gain=Vg\_f/Vg\_i\sim(1+Vs/Vg\_i)Rc/(1+Rc)\ (Vt\_gd<Vg\_i,Rc>>1)$$

Figures 1, 3A:
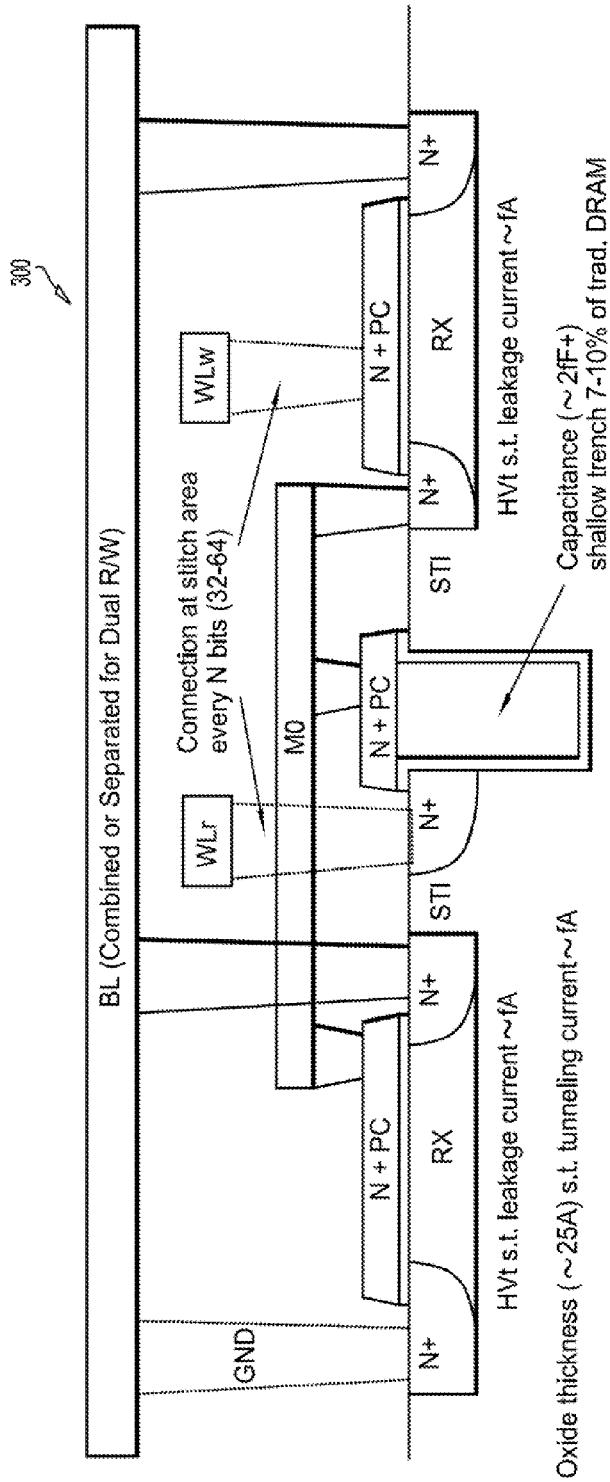
Figures 2, 3A:
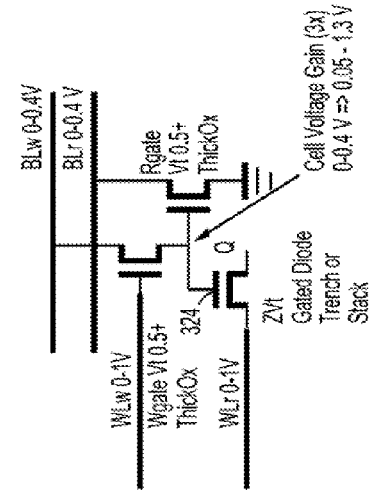

As shown in FIG. 3A, a Cross-section of an exemplary Single/Dual R/W Port 2T1D Memory Cell is indicated generally by the reference numeral 300. This exemplary 2T1D cell 300 includes a gated diode 324, uses metal connectors and is implemented using a trench. Here, the gated diode 324 is implemented in the form of a shallow trench, with the gate formed by the cylindrical poly trench surrounded by thin oxide separated with the silicon underneath. It shall be understood that the poly trench may have any cross-sectional shape, and is not limited to the exemplary cylindrical embodiment. The Single/Dual R/W Port 2T1D Memory Cell 300 has the following features:

NDR 2T1D Double Gain DRAM Cell
Nondestructive Read
Single or Dual R/W port
Low bitline (BL) voltage (0.4 V)
Low wordline (WL) voltage—No boosting needed, Small WL driver (1 V)
Gain in Read Device (Current)
Gain in Cell: Capacitor Voltage 0-0.4V to 0.05-1.3V, Gain=1.25/0.4=3.1
Thick Oxide, HVt in Rgate and Wgate to reduce leakage and tunneling current
During standby, BL's are grounded, minimal BL leakage current
For Read, BL precharged to VBLH (0.4 V)
Thick oxide FET to minimize gate-tunneling leakage
Negative wordline (WLw) (−0.5V) can be used to minimize standby channel leakage
Cg_cell~10-20×Cg_readdevice As shown in FIG. 3B, a Cross-section of an exemplary Single/Dual R/W Port 2T1D Memory Cell is indicated generally by the reference numeral 350. This exemplary 2T1D cell 350 includes a gated diode 374, uses alternate connectors and is implemented using a trench. Here, the gated diode 374 is implemented in the form of a shallow trench, with the gate formed by the cylindrical poly trench surrounded by thin oxide separated with the silicon underneath. It shall be understood that the poly trench may have any cross-sectional shape, and is not limited to the exemplary cylindrical embodiment. The Single/Dual R/W Port 2T1D Memory Cell 350 has the following features:

2T1D Double Gain DRAM Cell
Nondestructive Read
Single or Dual R/W port
Low bitline (BL) voltage (0.4 V)
Low wordline (WL) voltage—No boosting needed, Small WL driver (1 V)
Gain in Read Device (Current)
Gain in Cell: Capacitor Voltage 0-0.4V to 0.05-1.3V, Gain=1.25/0.4=3.1
Thick Oxide, HVt in Rgate and Wgate to reduce leakage and tunneling current
During standby, BL's are grounded, minimal BL leakage current
For Read, BL precharged to VBLH (0.4 V)
Thick oxide FET to minimize gate-tunneling leakage
Negative wordline (WLw) (−0.5V) can be used to minimize standby channel leakage
Cg_cell~10-20×Cg_readdevice Turning to FIG. 4, a Cross-section of another exemplary Single/Dual R/W Port 2T1D Memory Cell is indicated generally by the reference numeral 400. This exemplary 2T1D cell 400 includes a gated diode 424 and is implemented using a planar capacitor. The gated diode 424 is implemented using planar silicon on insulator (SOI) technology, with the gate above the diffusion area. The connection between the source of the first FET and the gate of the gated diode shown is based on a direct metal connector (MCBAR), but the common connection based on lowest level metal and contacts can be applied as shown in FIG. 3A. The Single/Dual R/W Port 2T1D Memory Cell 400 has the following features:

2T1D Double Gain DRAM Cell
Nondestructive Read
Single or Dual R/W port
Low bitline (BL) voltage (0.4 V)
Low wordline (WL) voltage—No boosting needed, Small WL driver (1 V)
Gain in Read Device (Current)
Gain in Cell: Capacitor Voltage 0-0.4V to 0.05-1.3V, Gain=1.25/0.4=3.1
Thick Oxide, HVt in Rgate and Wgate to reduce leakage and tunneling current
During standby, BL's are grounded, minimal BL leakage current
For Read, BL precharged to VBLH (0.4 V)
Thick oxide FET to minimize gate-tunneling leakage
Negative wordline (WLw) (−0.5V) can be used to minimize standby channel leakage
Cg_cell~10-20×Cg_readdevice Turning now to FIG. 5, a Single/Dual R/W Port 2T1D Memory Cell embodiment where the gated diode is implemented using planar bulk silicon technology, with an optional n-isolation band for p-well isolation used in triple-well implementation, is indicated generally by the reference numeral 450. The gated diode memory cell 450 has the same general characteristics as described above with respect to the gated diode memory cell 400 of FIG. 4, and duplicate description is omitted. The gated diode memory cell 450 includes a gated diode 474. Unlike the gated diode memory cell 400 of FIG. 4, the gated diode memory cell 450 of FIG. 5 includes an optional n-isolation band 460 disposed between the p-well 462 and the p-substrate 464 for p-well isolation.

Figure 6:
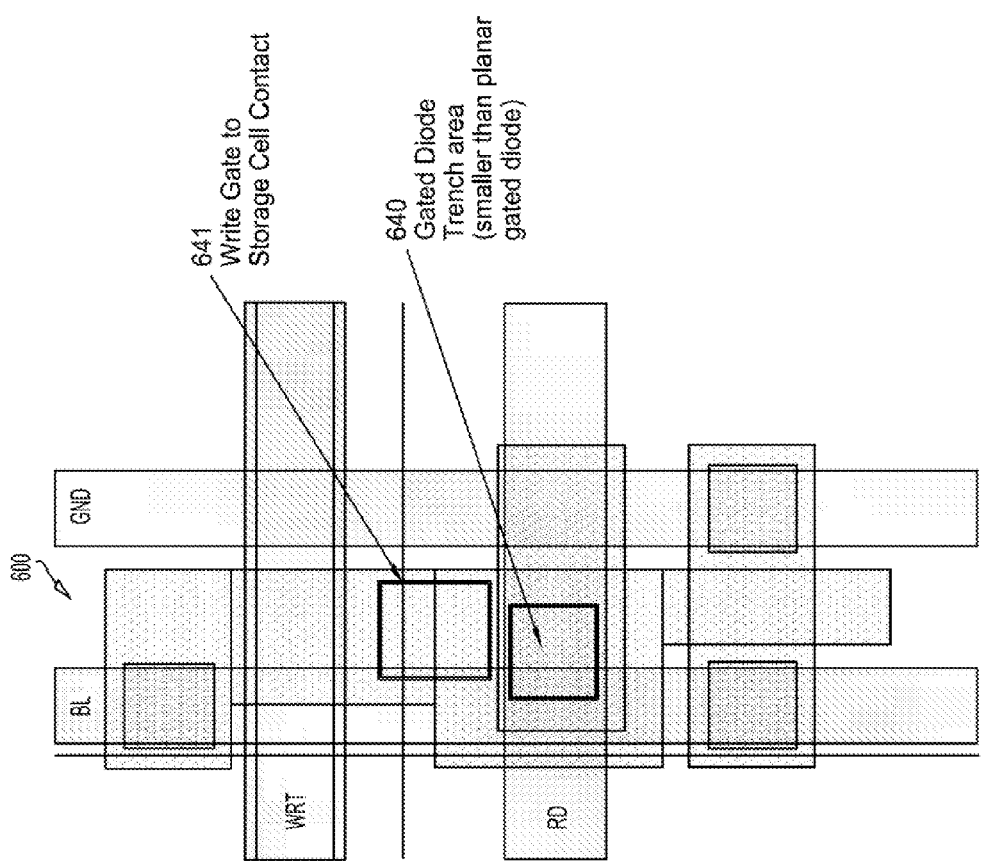
FIG. 6 shows an exemplary layout diagram of a 2T1D Memory Cell for either Planar or Trench Implementation embodiments of Gated Diode.

As shown in FIG. 6, an exemplary Layout of a 2T1D Memory Cell for either Planar or Trench Implementation of Gated Diode is indicated generally by the reference numeral 600. The 2T1D Memory Cell layout 600 includes a gated diode trench area 640, which is smaller than for the planar case, including a direct contact (MCBAR) from the source of the write device to the gate of the storage node. The 2T1D Memory Cell layout 600 further includes a write device to storage cell contact area 641.

Figure 7:
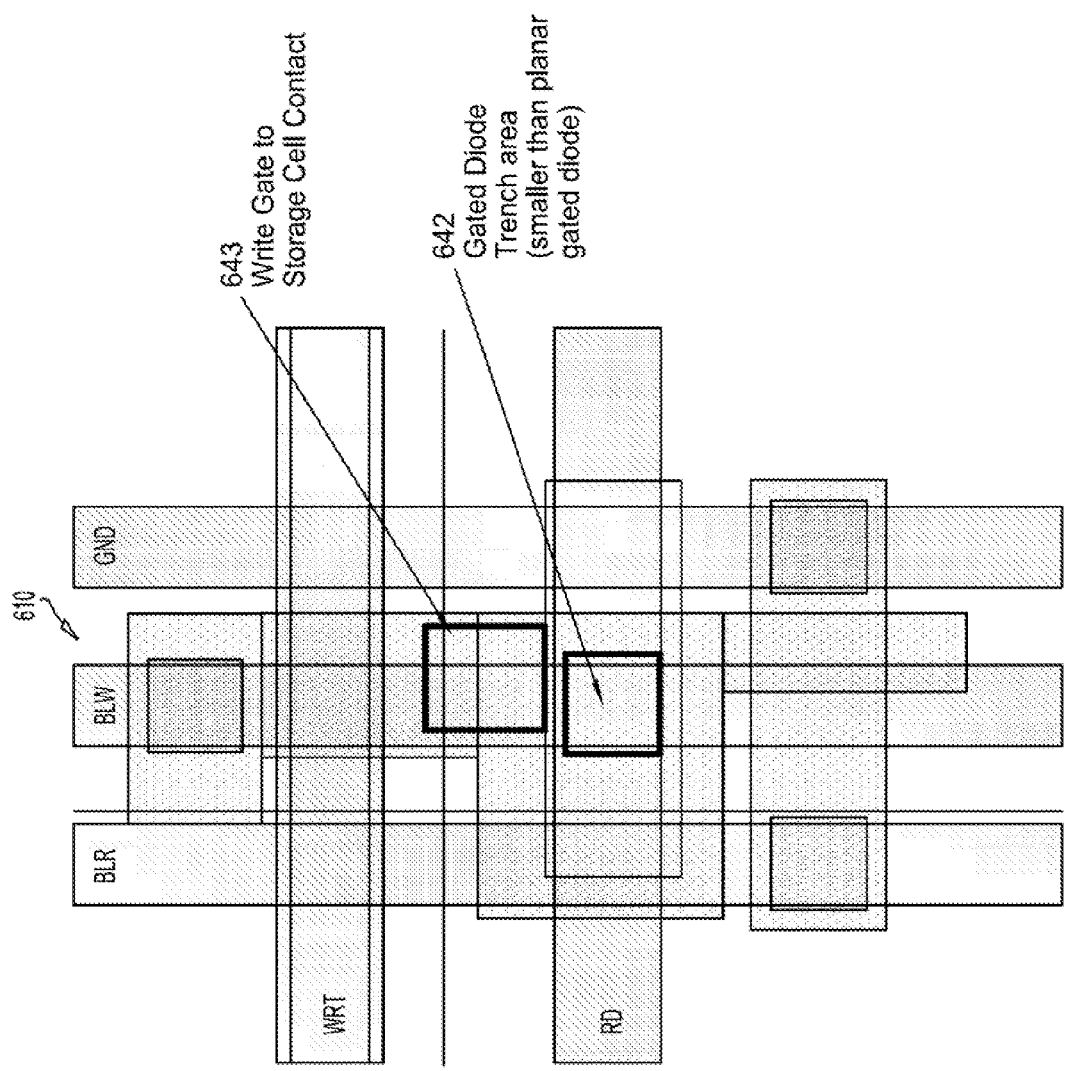
FIG. 7 shows an exemplary layout diagram of a Dual R/W Port 2T1D Memory Cell for either Planar or Trench Implementation embodiments of Gated Diode.

Turning to FIG. 7, an exemplary Layout of a Dual R/W Port 2T1D Memory Cell for either Planar or Trench Implementation of Gated Diode is indicated generally by the reference numeral 610. The Dual R/W Port 2T1D Memory Cell layout 610 includes a gated diode trench area 642, which is smaller than for the planar case, including a direct contact (MCBAR) from the source of the write device to the gate of the storage node. The Dual R/W Port 2T1D Memory Cell layout 610 further includes a write device to storage cell contact area 643.

Turning to FIG. 8, a plot of simulation waveforms of a 2T1D memory cell, such as 220 shown in FIG. 2C, is indicated generally by the reference numeral 800. The resulting simulation waveforms of Write 1, Read 1, Write 0, Read 0, . . . are shown. The 2T1D Memory Cells exhibit the following characteristics: VBLH=0.4 V, VWLW=0~1.0 V, VWLR=0~1.0V, Vcell=0.0~0.4 V (store), 0.05~1.3V (read), gated diode cell: 0.6 u×1.5 u (trench), zero Vt, read device: 0.28 u×0.12 u, BLcap~160 fF (256-cell bitline), 90 nm technology, R, W NFET: Vt=0.6 V, thick oxide, Rc=Cg_gd/Cg_rg=27, Gain=1.25/0.4=3.1. The plot 800 includes a wordline waveform 880 and a sense-amp-out waveform 882.

Figure 9:
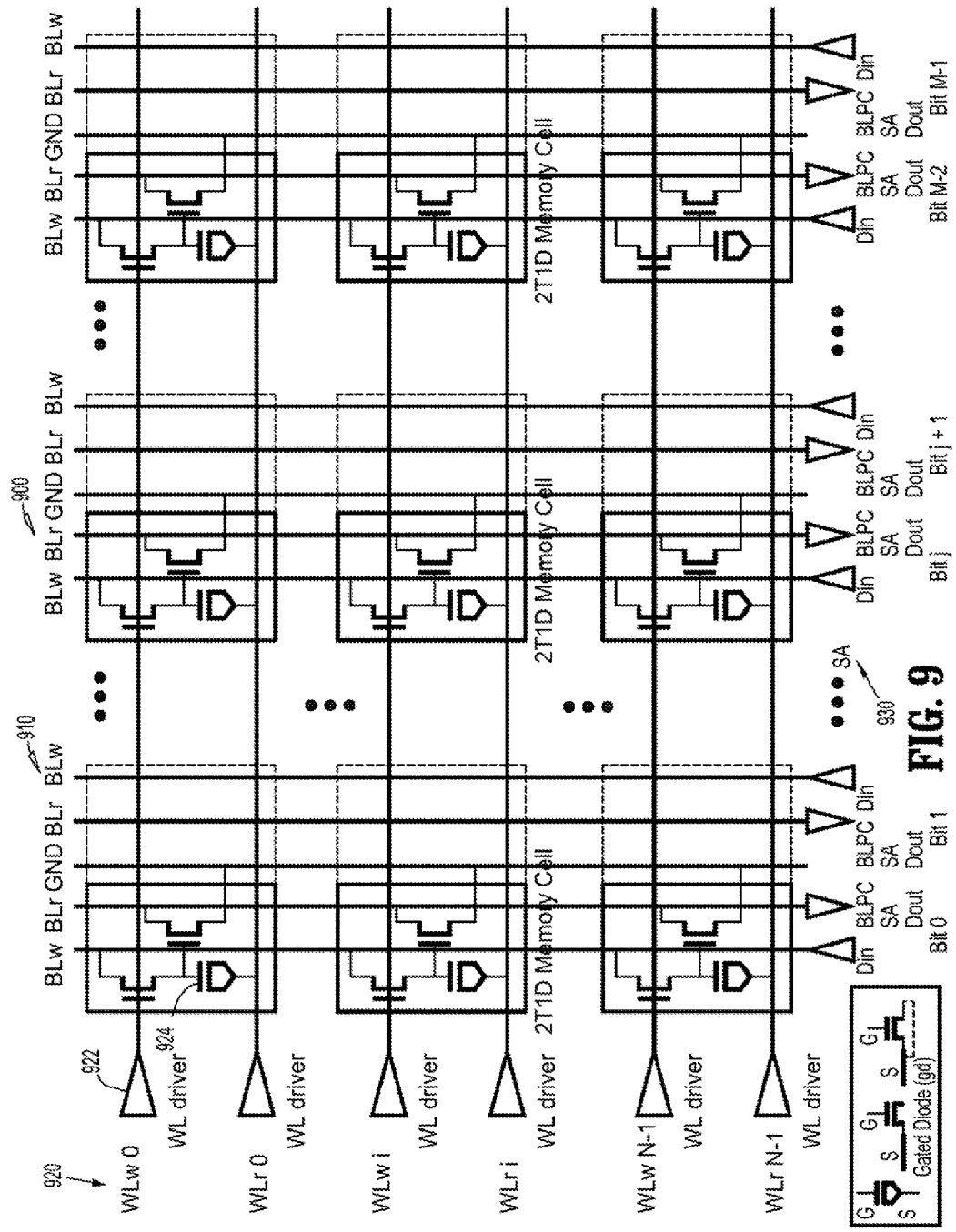
FIG. 9 shows a schematic diagram of a Dual R/W Port Array of 2T1D Memory Cells embodiment.

As shown in FIG. 9, an exemplary Dual R/W Port Array of 2T1D Memory Cells is indicated generally by the reference numeral 900, with Dual Port Bitlines 910, specifically Bitline 915 for write (BLw), Bitline 917 for read (BLr), Wordlines 920, specifically Wordline 925 for write (WLw), Wordline 927 for read (WLr), including Word Line Drivers 922, gated diodes 924 and Primary Sense Amplifiers 930.

Figure 10:
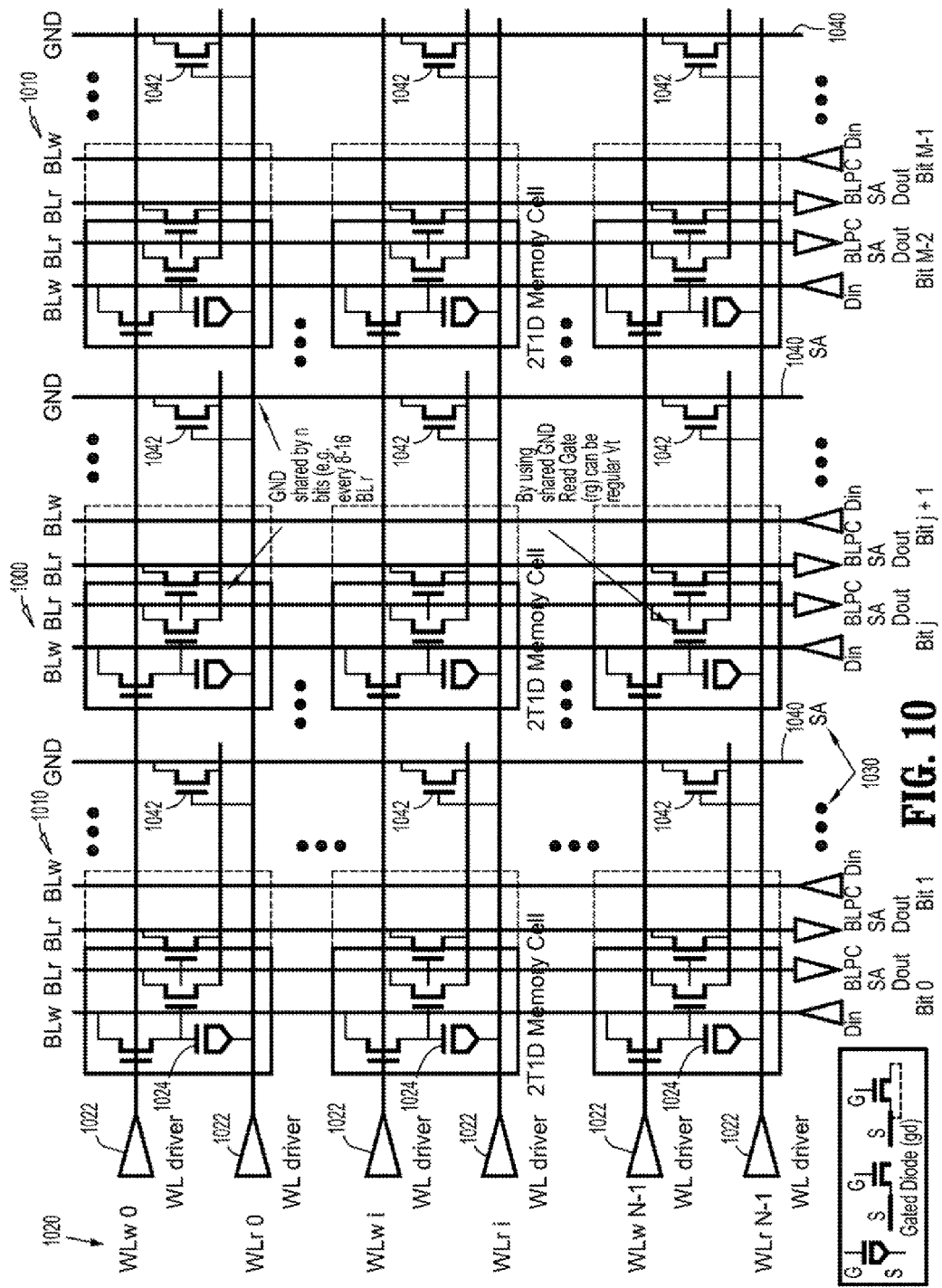
FIG. 10 shows a schematic diagram of a Dual R/W Port Array of 2T1D Memory Cells with Shared Ground embodiment.

Turning to FIG. 10, another exemplary Dual R/W Port Array of 2T1D Memory Cells is indicated generally by the reference numeral 1000, with Dual Port Bitlines 1010, Wordlines 1020, including Word Line Drivers 1022, gated diodes 1024 and Primary Sense Amplifiers 1030. This is a version of the array of 2T1D memory cells where a number of Read Devices (e.g., 8) along the same Read Wordline share a common Ground Line 1040 via a shared Cut-off NFET device 1042, which only turns on Rows that are active. This array has the advantage that area is smaller because less ground lines are needed. Further, the Cut-off device allows the Vt of the Read Devices to be lower (using Regular Vt) instead of needing to use High Vt, since non-active Read Devices for all other rows are shutoff by the Cut-off NFET, thereby preventing the possibility of leaking the bitlines. In this implementation, all devices in the array can be Regular Vt NFETs with lower threshold voltage than the high Vt ones.

Turning now to FIG. 11A, another exemplary embodiment of 2T1D Memory Cells is indicated generally by the reference numeral 1100, in which the source of the read device is connected to a biasing voltage (Vbias). Much like the 2T1D DRAM cell 120 of FIG. 1B, the 2T1D Memory Cell 1110 includes a first transistor 1112 in signal communication with a gated diode 1114 and a second transistor 1116, where the drains of the first transistor 1112 and the second transistor 1116 are connected to a common bitline, BL. In comparison, much like the 2T1D DRAM cell 220 of FIG. 2C, the 2T1D Memory Cell 1120 includes a first transistor 1122 in signal communication with a gated diode 1124 and a second transistor 1126, where the drain of the first transistor 1122 is connected to a write bitline, BLw, and the drain of the second transistor 1126 is connected to a read bitline, BLr. With a positive biasing voltage (Vbias), the threshold voltage of the read device (Vt_rg) can be reduced by an amount of Vbias. As a result, instead of high Vt device, regular Vt device can be used for the read device and the write device. It is advantageous for neighboring devices to have the same threshold voltage so that they can be grouped in the same implantation region to minimize layout area. Exemplary operating voltages of this "Vbias" embodiment are as follows: Vbias=0.4 V, and regular Vt FET, with threshold voltage about 0.2 V, can be used for the write and read devices.

Figure 11B:
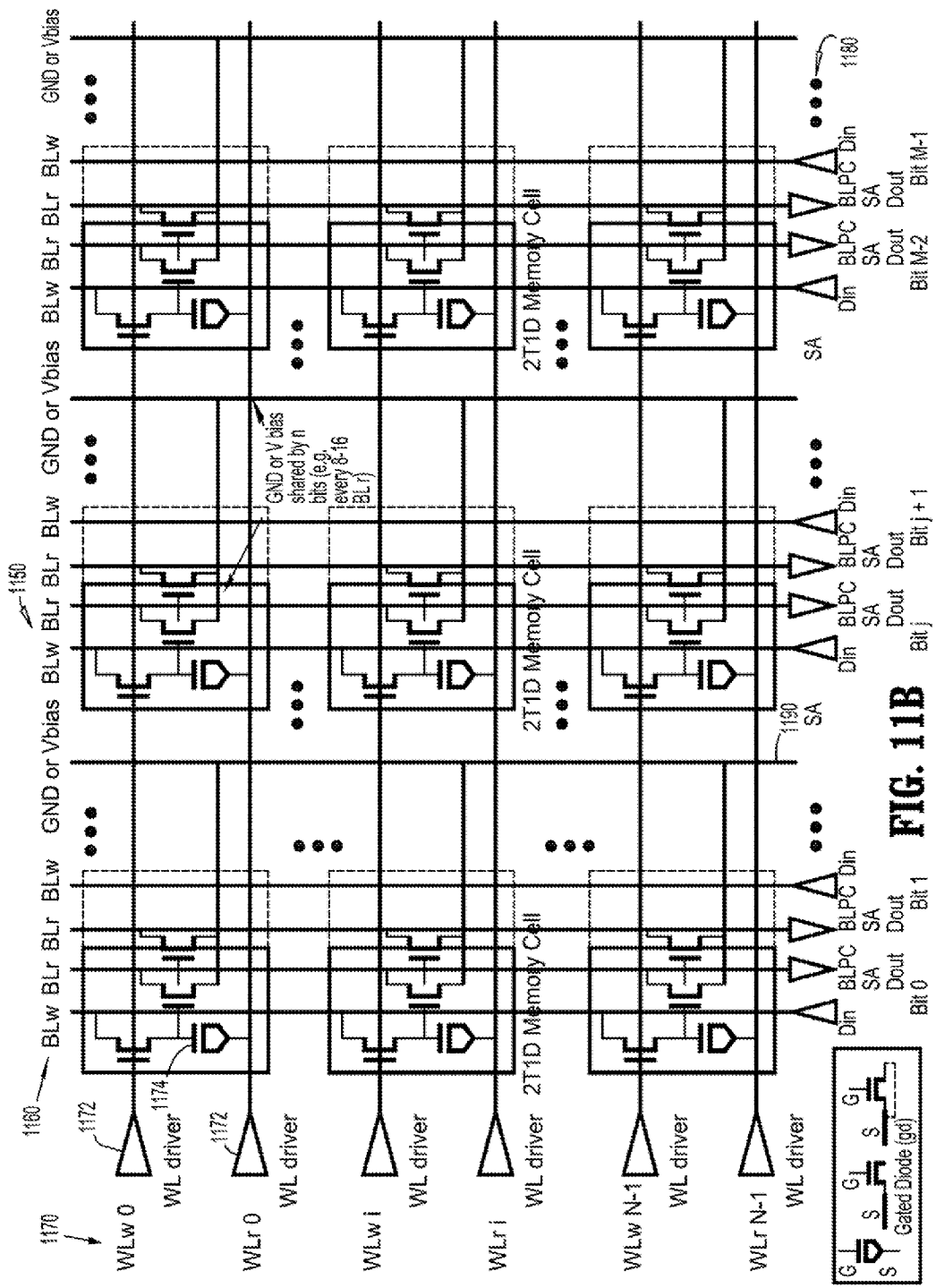
FIG. 11B shows a schematic diagram of a Dual R/W Port Array of 2T1D Memory Cells with Shared Ground or Shared Vbias embodiment in accordance with FIG. 11A.

As shown in FIG. 11B, an array structure of the 2T1D memory cells of FIG. 11A is indicated generally by the reference numeral 1150. The array structure 1150 uses a direct shared Ground or shared Vbias line scheme, and includes Dual Port Bitlines 1160, Wordlines 1170, including Word Line Drivers 1172, gated diodes 1174 and Primary Sense Amplifiers 1180. This is a version of the array of 2T1D memory cells where a number of Read Devices (e.g., 8) along the same Read Wordline share a common Ground Line 1190. It shall be understood that the concept of a shared Ground line among a number of memory cells in the wordline direction can be applied to the 2T1D array structure as shown in FIG. 9, and the 2T1D memory cell as shown in FIG. 11A, without the use of cut-off devices. The source terminals of a number of memory cells in the wordline direction are connected locally in the wordline direction, and then connected directly (without a cut-off device) to a common Ground line or a common biasing voltage line (Vbias) running orthogonally in the bitline direction. Thus, the array structure of this direct shared Ground line scheme or direct shared biasing voltage line is as shown in FIG. 11B.

Figure 12:
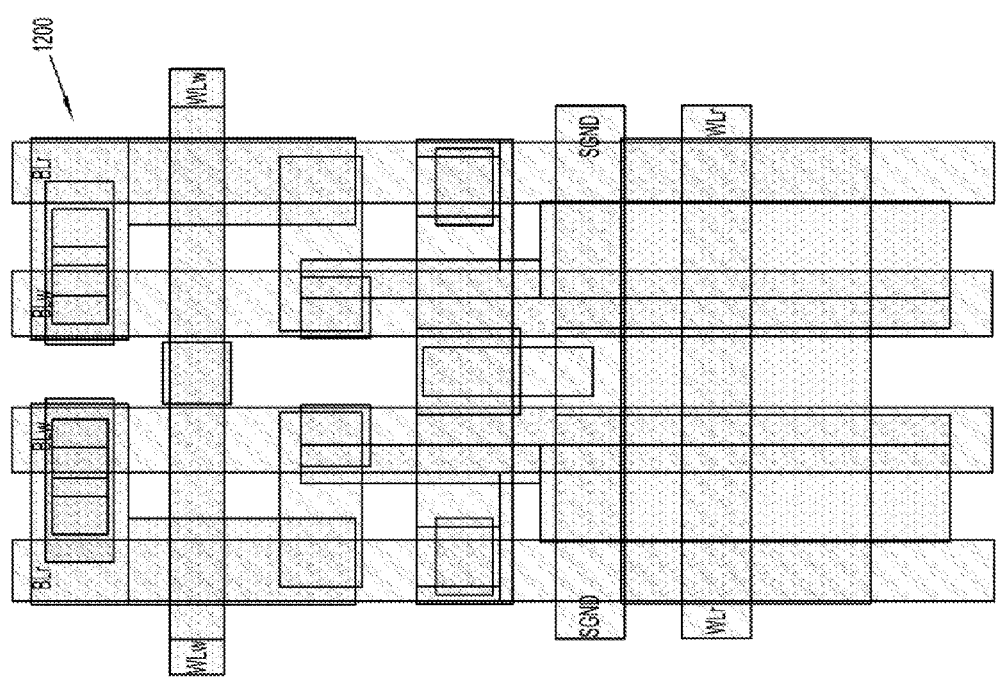
FIG. 12 shows an exemplary layout diagram of a two-by-one Dual R/W Port 2T1D array of Memory Cells with Planar Gated Diodes and Shared Ground.

Turning to FIG. 12, an exemplary Layout of two Dual Port (R/W) 2T1D Memory Cell with Planar Gated Diode is indicated generally by the reference numeral 1200. Here, the Read Device GND such as GND 1040 of FIG. 10 is shared among a Row of 2T1D Cells.

Figures 1, 13:
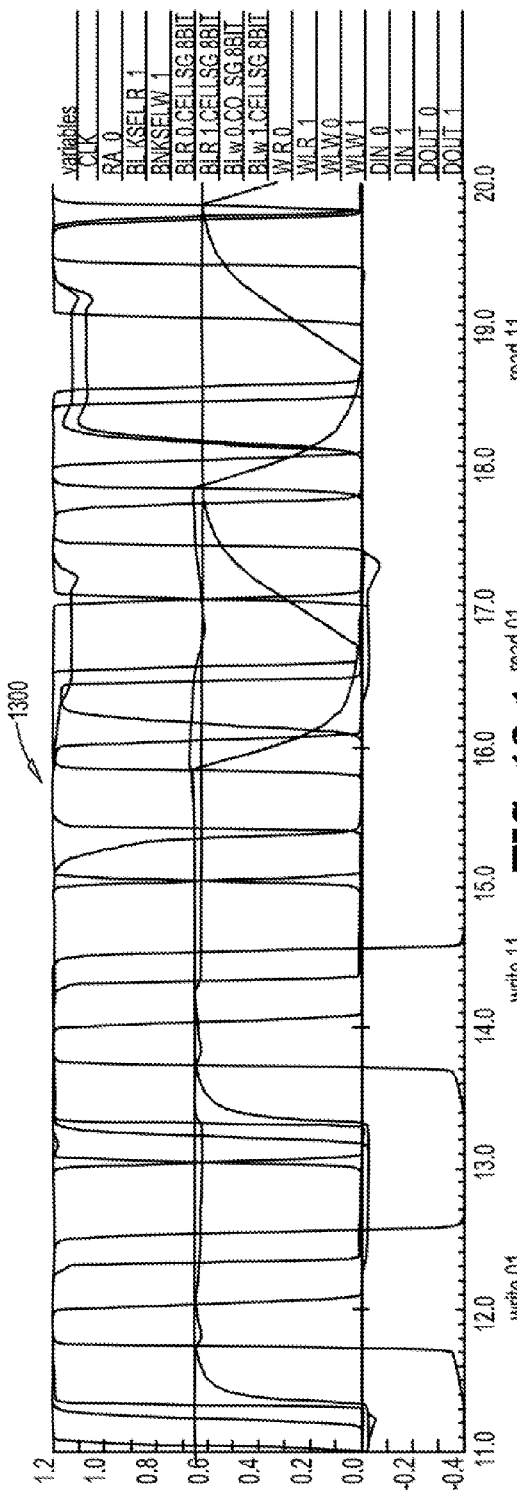
Figures 2, 13:
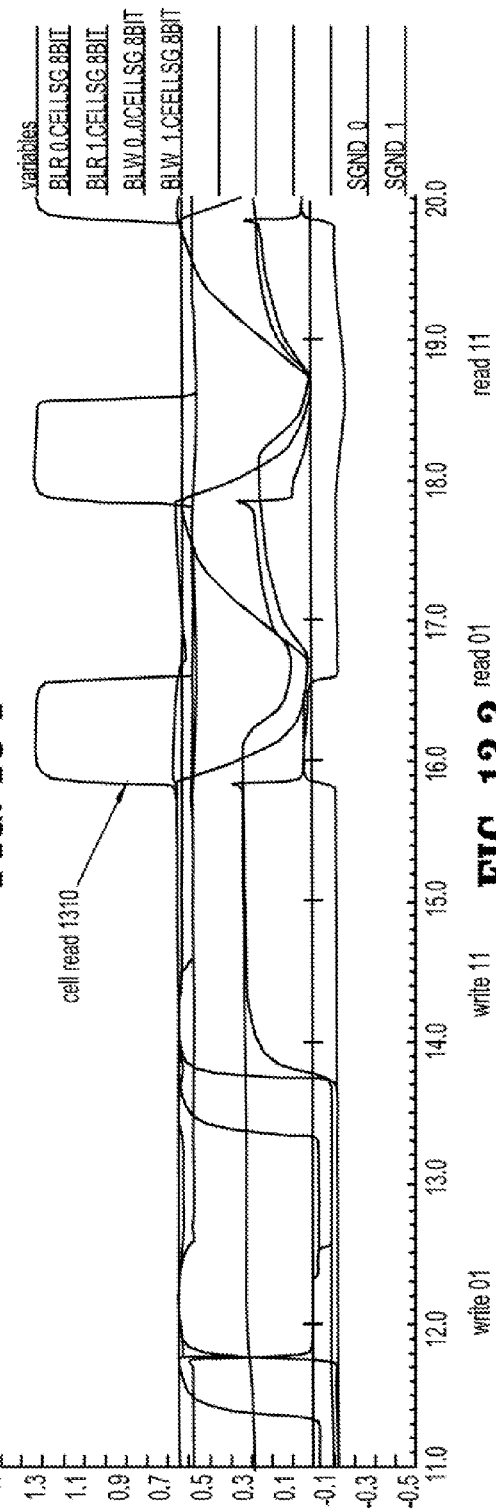

Turning now to FIG. 13, simulation waveforms for the 2T1D Dual Port R/W Array 1000 of FIG. 10 are indicated generally by the reference numeral 1300, with a cell-read waveform 1310. Four 2T1D cells from two different WLs and two different BLs are written and read successively with patterns 01, 11. Here, the 2T1D Dual R/W Port Array 1000 of FIG. 10 exhibits the following characteristics: VBLH=0.65 V, VWLW=−0.4~1.2 V, VWLR=0~1.2 V, Vcell=0.0~0.6 V (store), 0.05~1.35V (read), gated diode cell: planar, 0.72 u×0.35 u, zero Vt, read device: 0.28 u×0.12 u, write device: 0.28 u×0.16 u, 120 nm technology, R, W NFET: Vt=0.6V, Rc=Cg_gd/Cg_rg=7.5, Gain=1.3/0.6=2.1.

As shown in FIG. 14, an exemplary n-type Gated Diode Planar Structure in Bulk Silicon/SOI is indicated generally by the reference numeral 1400. A gated diode with open drain in the implementing FET is indicated by the reference numeral 1414, and includes a gate terminal 1416 and a source terminal 1418. A gated diode with open drain in the implementing FET and optional n-isolation band 1429 is indicated by the reference numeral 1424, and includes a gate terminal 1426 and a source terminal 1428. A gated diode with open drain in the implementing FET and insulator 1437 is indicated by the reference numeral 1434, and includes a gate terminal 1436 and a source terminal 1438.

A gated diode with drain in the implementing FET shorted to source is indicated by the reference numeral 1464, and includes a source terminal 1468, gate terminal 1466 and a drain terminal 1465 in the implementing FET shorted to the source terminal 1468. A gated diode with drain in the implementing FET shorted to source and optional n-isolation band 1479 is indicated by the reference numeral 1474, and includes a source terminal 1478, a gate terminal 1476 and a drain terminal 1475 in the implementing FET shorted to the source terminal 1478. A gated diode with drain in the implementing FET shorted to source and insulator 1487 is indicated by the reference numeral 1484, and includes a source terminal 1488, a gate terminal 1486 and a drain terminal 1485 in the implementing FET shorted to the source terminal 1488.

Turning to FIG. 15, an exemplary p-type Gated Diode Planar Structure in Bulk Silicon/SOI is indicated generally by the reference numeral 1500. A gated diode with open drain in the implementing FET is indicated by the reference numeral 1514, and includes a gate terminal 1516 and a source terminal 1518. A gated diode with open drain in the implementing FET and bulk p-substrate 1523 is indicated by the reference numeral 1524, and includes a gate terminal 1526 and a source terminal 1528. A gated diode with open drain in the implementing FET and insulator 1537 is indicated by the reference numeral 1534, and includes a gate terminal 1536 and a source terminal 1538.

A gated diode with drain in the implementing FET shorted to source is indicated by the reference numeral 1564, and includes a source terminal 1568, gate terminal 1566 and a drain terminal 1565 in the implementing FET shorted to the source terminal 1568. A gated diode with drain in the implementing FET shorted to source and bulk p-substrate 1573 is indicated by the reference numeral 1574, and includes a source terminal 1578, a gate terminal 1576 and a drain terminal 1575 in the implementing FET shorted to the source terminal 1578. A gated diode with drain in the implementing FET shorted to source and insulator 1587 is indicated by the reference numeral 1584, and includes a source terminal 1588, a gate terminal 1586 and a drain terminal 1585 in the implementing FET shorted to the source terminal 1588.

Figures 1, 16:
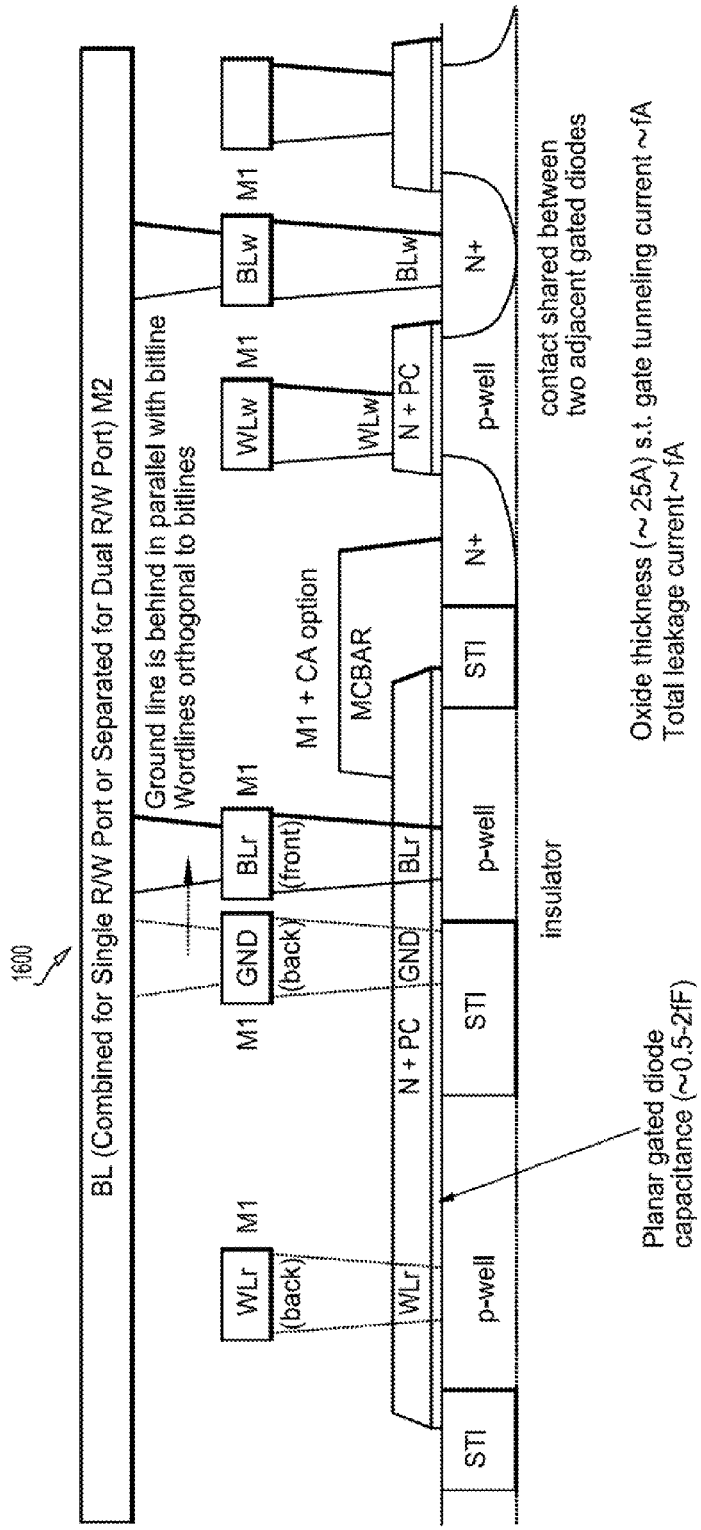
Figures 2, 16:
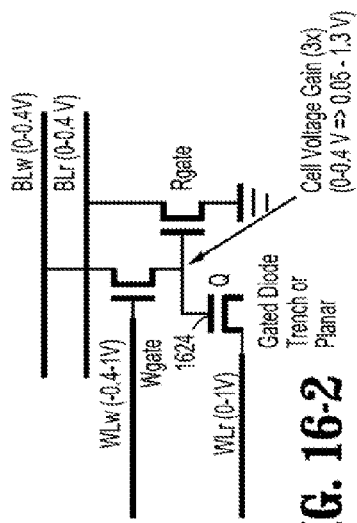

As shown in FIG. 16, another exemplary 2T1D Gated Diode Planar Memory Cell Structure with Single/Dual R/W Port is indicated generally by the reference numeral 1600. The 2T1D Gated Diode Planar Memory Cell Structure 1600 includes a gated diode 1624. Here, the exemplary 2T1D Gated Diode Planar (or Trench) Memory Cell may have the following characteristics. A Nondestructive Read; Single or Dual R/W port or Multiple R/W port; Low Bitline (BL) voltage (about 0.4 V); Low Wordline (WL) voltage—No voltage boosting needed (about 1 V), Small WL driver; Gain in Read Device (Current); Gain in Cell: Capacitor Voltage about 0-0.4V to about 0.05-1.3V, Gain=about 1.25/0.4=about 3.1; Thick Oxide, HVt in Rgate and Wgate to reduce leakage and tunneling current; During standby, BL's are grounded, minimal BL leakage current; For Read, BL precharged to VBLH (about 0.4 V); Thick oxide FET to minimize gate tunneling leakage; Negative wordline (WLw) (about negative 0.5V) can be used to minimize standby channel leakage; and Cg_cell about 10-20 times Cg_rg.

Figures 1, 17:
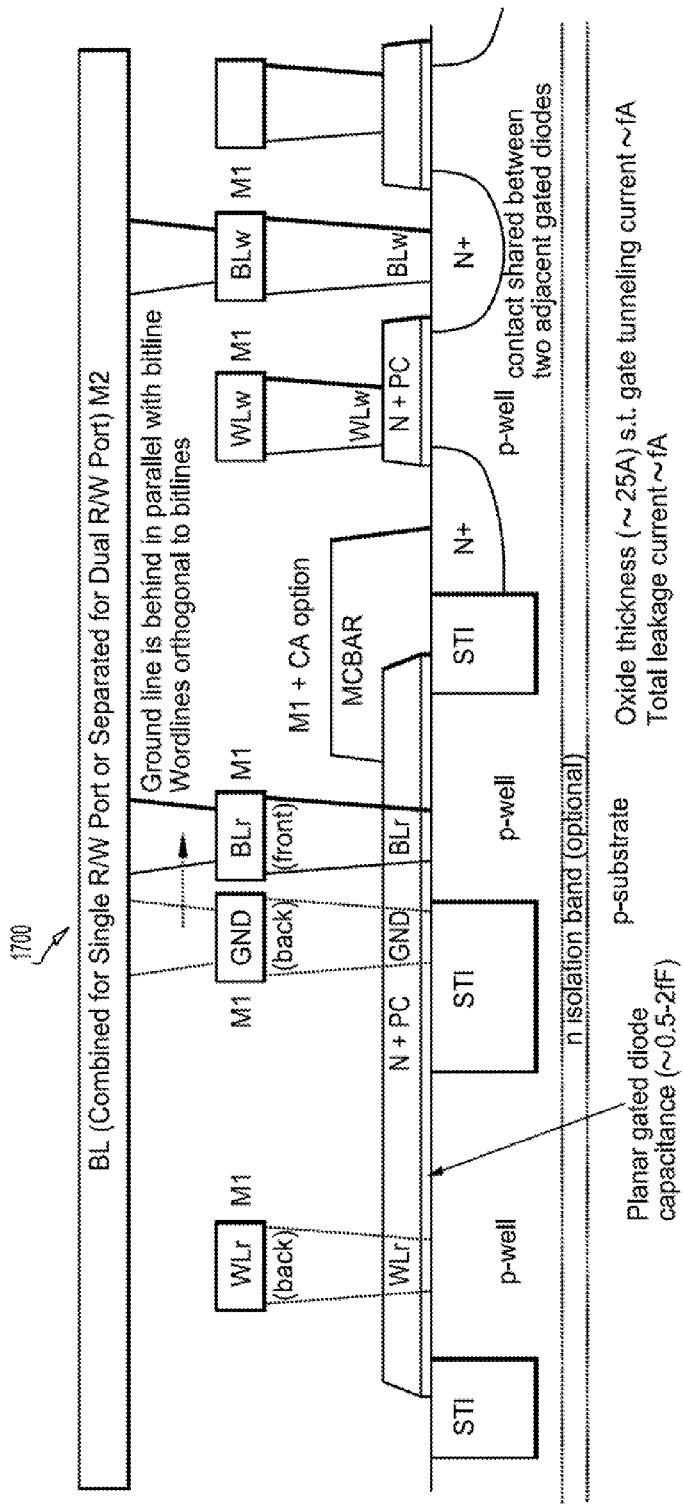
Figures 2, 17:
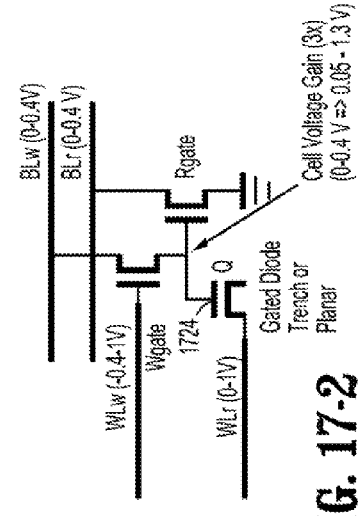

Turning now to FIG. 17, another exemplary 2T1D Gated Diode Planar Memory Cell Structure with Single/Dual R/W Port and an optional n-isolation band to isolate the p-well is indicated generally by the reference numeral 1700. The 2T1D Gated Diode Planar Memory Cell Structure 1700 includes a gated diode 1724. Here, the exemplary 2T1D Gated Diode Planar (or Trench) Memory Cell with optional n-isolation band may have the same general characteristics as those described above for the exemplary 2T1D Gated Diode Planar Memory Cell 1600 of FIG. 16.

Thus, embodiments of the present disclosure provide a new gated diode memory cell, which includes a "partial" field-effect transistor ("FET") where the gate forms one terminal of the storage cell and the source forms the other terminal of the storage cell. The gated diode can be implemented as a "partial" conventional field-effect transistor with the drain of the FET left open; or with the drain of a conventional FET connected to the source, functioning as two "partial" field-effect transistors connected in parallel, or two gated diodes connected in parallel. The parallel gated diodes are used interchangeably as a gate diode. The gated diode does more than a pure storage capacitor during memory Read/Write operations, compared to what conventional dynamic memory cells do. It exhibits additional interesting characteristics that allow the memory cell voltage to have a voltage gain (i.e., greater than 1) during a Read operation, compared to the voltage drop in conventional 1T1C memory cells or the constant cell voltage in conventional 2T1C cases. This is achieved by transferring substantially some or all of the charge stored in the gated diode memory cell out to a corresponding connected circuit, such as a bitline and sensing circuit, instead of sharing the charge as in conventional storage capacitors to satisfy the linear voltage equalization conditions when the cell is Read.

The stored charge in the gated diode memory cell is transferred out to the connected neighboring circuit (such as a bitline in a 1T1D memory cell, or the gate of a read device in a 2T1D memory cell) in a nonlinear operation as the gated diode is changed from an ON storing state, where the charge is stored in the inversion layer of the FET with the ON gate voltage, to the OFF emptying state, where the FET is OFF with no charge or orders of magnitude smaller amount of charge stored in the FET channel. The complete charge transfer accounts for the cell voltage gain during a Read operation. The gated diode memory cell can be configured for 1T1D DRAM as indicated generally by the reference numeral 110 of FIG. 1A, or it can be configured for 2T1D DRAM as indicated generally by the reference numeral 120 of FIG. 1B.

The right-hand-side sub-figures 110 of FIG. 1A and 120 of FIG. 1B show the circuit schematics of a memory cell structure using a gated diode for 1T1D and 2T1D configurations, respectively. The gate of the gated diode forms the storage node of the memory cell. The gate voltage is High at V_cell(1), or typically VBLH, when a 1-data is stored in the gate capacitor. The gate voltage is Low at V_cell(0), usually 0, and is below the gate threshold voltage when a 0-data is stored, and the gate capacitance is about zero, or an order of magnitude smaller than that for a 1-data. This much smaller capacitance at the gate is mainly from secondary effect made up of the overlapping capacitance between the gate and the source of the gate diode and any surrounding stray capacitance.

It should be pointed out that the smaller capacitance for 0-data does not have to be exactly an order of magnitude smaller than that for a 1-data to achieve voltage gain. It can be orders of magnitude smaller, or only slightly smaller, or even comparable to that for a 1-data. The ratio of the capacitance for 1-data to 0-data would affect the gain of the gated diode as described earlier, but not the basic operation and functionality. The "order of magnitude smaller" description is used for typical design illustration for the design of the gated diode.

During a Write operation or storing period, the source of the gated diode is at a Low voltage, typically 0 or grounded. For writing a 1-data to the cell with the gate of the gated diode at High, which is V_cell(1) or typically VBLH, the charge stored, Q_cell(1), would be (V_cell(1)−Vt_cell) C_cell, where Vt_cell or Vt_gd is the threshold voltage of the gated diode and C_cell is the ON gate capacitance. It is advantageous to have Vt small so that more charge can be written to the cell for storage and getting more signal for sensing, so a zero Vt device or a low Vt device can be used. The charge Q_cell(1) corresponds to the 1-data and is stored in the inversion layer between the gate and the channel. For 0-data, the charge Q_cell(0) stored is negligible or 0, and the gate capacitance is about zero, or an order of magnitude smaller than that for 1-data. The memory cell is connected via a switch, such as a wordline ("WL") control gate, to turn on/off for read and write to a bitline ("BL") in the case of the 1T1D DRAM 110 of FIG. 1A, or directly to the gate of the read device in the case of the 2T1D cell 120 of FIG. 1B. The left portion of FIG. 1A and FIG. 1B show using regular capacitors for the conventional 1T1C DRAM (reference numeral 10) and 2T1C DRAM (reference numeral 20), respectively.

During a Read operation, the other terminal of the memory cell, the source of the gated diode, is raised by a voltage higher than the threshold voltage Vt of the gated diode, plus the final gate voltage of the gated diode:

$$Vs\_gd > Vg\_gd - Vt\_gd \quad (1a)$$

to turn the gated diode off. Subsequently, the charge stored in the inversion layer between the gate of the gated diode and the channel for holding the memory data is transferred to the connecting capacitors, which are connected to either (1) the connecting BL (assuming the WL control gate has been open) in the case of the 1T1D DRAM 110 of FIG. 1A, or (2) the FET gate of the read device in the case of the 2T1D DRAM 120 of FIG. 1B, plus any associated stray capacitance (C_stray) at the gate of the gated diode.

For the 2T1D memory cell, the gate capacitance of the read device (Cg_rg) is itself depending on the voltage stored in the gate diode. The above combined connecting capacitance can be considered as one capacitance C_load in the analysis, and sometime used interchangeably with Cg_rg. That is, C_load=Cg_rg+C_stray, C_load~Cg_rg.

It is this complete charge transfer, instead of charge equalization or sharing as in the prior art that enables the boosting of the cell voltage during the Read operation so as to achieve much larger signals. The charge stored in the gated diode for 1-data is given by:

$$Q\_stored = (Vg\_gd\_initial - Vt\_gd) Cg\_gd \quad (1b)$$

The charge transfer out of the gated diode, which is the complete charge transfer under condition of equation (1a), is given by:

$$Q\_transfer = Q\_stored \quad (1c)$$

Thus, Cg_gd is a function of its gate voltage, and the charge stored and transferred out of the gate diode is independent of the final gate voltage provided that the source voltage of the gated diode Vs_gd is set high enough as described in equation (1a). This is called the complete charge transfer. In the case that the complete charge transfer condition set by equation (1a) does not hold, the charge transfer operation will go into the constrained charge transfer mode in which a specific initial amount of charge, determined by Vs_gd and Vg_gd_initial, will be transferred out from the gated diode to the connecting nodes, such as the read device, bitline, and the like. The remaining charge will be shared between the gated diode and the connecting nodes.

The principles of operation of the Gated Diode Memory Cell will now be described. Referring back to FIG. 2C, the schematic of the gated diode memory cell is useful to illustrate its operation in a 2T1D memory cell array. As shown in FIG. 2C, there are two wordlines, one for Write (WLw) and one for Read (WLr) going into each memory cell. There are also two bitlines, one for Write (BLw) and one for Read (BLr) going into the same cell. With separate bitline for Read and Write, it is a Read/Write dual port memory cell.

As shown in FIG. 1B, the two bitlines can be combined into a single bitline, resulting in a single port memory cell. The two port memory cell requires more wiring area, but a set of memory cells in one wordline and another set of memory cells in another wordline can be read and written at the same time, hence doubling the maximum memory read and write data throughput, whereas for the single port memory cell, the Read and Write operations have to be completely separated, resulting in smaller read and write data throughput. There is no difference in the gated diode principle of operation in both cases.

The Read/Write operations of the gated diode have been described earlier. In the context of this 2T1D memory cell, for Write operation, the wordline WLw is raised from Low to High (VWLH) so the 0-data or 1-data (VBLH) on the bitline can be written into the gate of the gated diode via the write device (whose gate is connected to WLw). Typically, pertaining to the technology level that they are part of, VWLH=1-1.2 V, VBLH=0.4 V, Vt_writedevice=0.5 V. Small wordline voltage is enough to drive this kind of memory cell, resulted in very area-efficient wordline drivers compared to the large, boosted wordline drivers in conventional DRAM.

Gated Diode Signal Amplification is now considered, as illustrated in FIG. 2A and FIG. 2B. For Read operation, the source of the gated diode connected to the wordline WLr is raised from Low (GND) to High (VWLH). When 0-data is stored in the memory cell, there is zero or very little charge stored in the gated diode, and the capacitance across the gated diode is very small. When WLr is raised, there is only a very slight increase in voltage at the storage node (gate of the gated diode) because the coupling effect is very small. The 0-data coupling effect comes from the voltage divider formed by the gated diode capacitance (almost zero, or order of magnitude smaller) and the combined loading and stray capacitance of the connecting nodes to the gate of the gated diode, the combined loading and stray capacitance part being bigger, say typically 10 to 1. The voltage increase at the storage node for 0-data Read is very small, of the order of VWLH/10 (about 100 mV). When 1-data (VBLH) is stored in the memory cell, there is lots of charge (Q_stored) stored in the gated diode and the capacitance across the gated diode is large. When WLr is raised, so is the source voltage (Vs) of the gate diode, the voltage (Vg) at the storage node is boosted to $$Vg\_f = Vs\ cc + Vg\_i \qquad (2a)$$

$$cc = Cg\_gd/(Cg\_gd + C\_load) \qquad (2b)$$

where cc is the coupling coefficient of the voltage divider formed by the gated diode gate to source capacitance (Cg_gd) and the combined load capacitance (C_load) of the connecting nodes to the gate of the gated diode, Vg_i is the initial voltage Vg at the gate of the gated diode (storage node) and Vg_f is the voltage Vg after the voltage of WLr is raised.

Cg_gd can be considered as having two components, a stray gate-source overlapping capacitance (Cs_gd) and a varying gate capacitance (Cg_gd') formed by the oxide capacitance to the FET inversion channel. Cg_gd' varies by orders of magnitude when the Vgs of gated diode is changing from below Vt (OFF) to much above Vt (ON). The stray gate-source overlapping capacitance can be considered as the gated diode OFF capacitance Cg_gd(OFF), its value is small when the gated diode stores negligible or no charge in the channel. When the gated diode is fully ON, the capacitance Cg_gd is the gated diode ON capacitance (Cg_gd(ON)), the gated diode stores a significant amount of charge in the inversion layer. So Cg_gd(OFF)=Cs_gd, Cg_gd(ON)=Cs_gd+Cox_gd, where Cox_gd is the full gate oxide capacitance of the gated diode.

The basic principle of operation of the gated diode signal amplification is summarized in FIG. 2A. The capacitance of the ON/OFF gated diode, the load capacitance C_load, Cg_rg are generally, but not limited to:

Cg_gd(ON)>C_load, Cg_rg>>Cg_gd(OFF)

Typically:

Cg_gd(OFF): C_load: Cg_gd(ON)=1:10:100

VWLH=1V, VBLH=0.4 V

Referring back to FIG. 2A, the case of a gated diode amplifier connected to a capacitive load CL was indicated generally by the reference numeral 200. It should be pointed out that the load capacitance (C_load) described earlier (equation (2b)) can be considered as the capacitive load CL in this setting. An exemplary relationship of the ON, OFF and loading capacitance of the gated diode operation follows:

Cg_gd(ON)>CL>>Cg_gd(OFF)

Typically,

TABLE 1

Gated Diode Voltage Gain for 0-Data and 1-Data
Cg_gd(OFF):CL:Cg_gd(ON) = 1:10:100

|  | 0-data | 1-data |
| --- | --- | --- |
| Cg_gd | Cg_gd(OFF) << C_load | Cg_gd(ON) > C_load |
| cc | cc(OFF) = 0.09~0.1 | cc(ON) = 0.91~0.9 |
| Vg_f | 0.1 VWLH | 0.9 (VWLH + VBLH) |
|  | 0.1 V | 1.3 V |

Table 1 shows the operation (read) of a gated diode memory cell under two different states, namely 0-data and 1-data, under typical conditions of Cg_gd(OFF), C_load (or sometimes written as CL), and Cg_gd(ON) as described earlier. The voltage difference in the gated diode before the operation is 0.4 V, while the voltage difference in the gated diode after the operation is 1.3-0.1=1.2 V. This results in a big voltage difference between the two states 0- and 1-data. Indeed, a voltage gain of about 3× (which is equal to 1.2/0.4) in the memory cell, illustrating the signal amplification function of the gated diode amplifier. If the gated diode is replaced by a capacitor, the 0- and 1-voltage after the operation would be 0.9 V and 1.3 V respectively. Between 0-data and 1-data, the voltage difference in the gated diode before the operation is 0.4 V, and the voltage difference in the gated diode after the operation is (slightly less) 0.4 V, and there would be no voltage gain (gain slightly less than or equal to 1) from the operation.

The operation and analysis of a 2T1D Gated Diode Memory Cell is now considered. In the case of 2T1D as shown in FIGS. 1B and 2C, when the source of the gated diode is raised by a voltage higher than the final voltage at the gate of the gated diode minus the threshold (Vt) of the gate diode as described in equation (1), complete charge transfer occurs. The charge is transferred to the gate of the read device and would result an increase in gate voltage given by:

Let
Vt_gd be the gated diode threshold voltage, zero Vt or low Vt,
Cg_rg be the gate capacitance of the read device,
Vt_rg be the threshold voltage of the read device, Q_stored and Q_transfer be the charge stored and transferred, Vs_gd as Vs, Vg_gd_initial as Vg_i, Vg_gd_final as Vg_f.

$$Rc=Cg\_gd/Cg\_rg \sim Cg\_gd/C\_load \ (C\_load \sim Cg\_rg) \quad (5)$$

$$Q\_stored=(Vg\_i-Vt\_gd)Cg\_gd,$$

Complete charge transfer (Vg_f<=Vs+Vt_gd):

$$Q\_transfer=(Vg\_f-Vt\_rg)Cg\_rg=Q\_stored \quad (3a)$$

$$Vg\_f=Q\_stored/Cg\_rg+Vt\_rg=(Vg\_i-Vt\_gd)Cg\_gd/Cg\_rg+Vt\_rg$$

$$Vg\_f=Vg\_i \ Rc+Vt\_rg-Vt\_gd \ Rc \quad (3b)$$

$$Gain=Vg\_f/Vg\_i \sim 1+Rc \quad (3c)$$

(Vt_rg>Vg_i, Vt_gd and Rc are small)

At maximal charge transfer, Vg_f=Vs+Vt_gd, $$Rc=(Vs+Vt\_gd-Vt\_rg)/(Vg\_i-Vt\_gd)$$

Typically, Vs is two to three times Vg_i, where Vg_i<Vt_rg, Vt_gd~0. Rc is around 1-2.

In the situation where Vs_gd (same as Vs) is constrained such that the condition described in equation (1) does not hold, then not all the charge are transferred out of the gated diode.

For example, in the case of 2T1D, if Cg_gd>>Cg_rg, say at least 10× as big, assuming:

$$Vt\_gd=0$$

$$Vt\_rg=0.5 \ V$$

$$Vg\_i=0.4 \ V$$

$$Vs=0 \rightarrow 1 \ V \ (raised \ from \ 0 \ V \ to \ 1 \ V)$$

$$Q\_stored=(Vg\_i-Vt\_gd)Cg\_gd$$

The charge is transferred to the gate of the read device and would result potentially in a large increase in gate voltage as described in equation (3b). In the above example, Vg_f would be about 11 Vg_i (since Rc=Cg_gd/Cg_rg=10). This would result in a violation of the condition described in equation (1) in holding the gated diode OFF in order to complete the charge transfer, resulting in the situation known as "constrained charge transfer". Some charges are held back in the gated diode. The final gate voltage (Vg_f) of the gated diode is between:

$$Vg\_i<Vg\_f<Vg\_i \ Rc+Vt\_rg-Vt\_gd \ Rc \quad (4)$$

That is still a good voltage gain even though Vs and charge transfer are constrained. The gated diode remains ON at the end holding some charges with Vg_f>Vs+Vt_gd.

In the case of 2T1D, this occurs when Cg_gd is much bigger than Cg_rg (e.g. 10×), it has the advantages that:
(1) The gate voltage of the read device is still much higher than the stored cell voltage (Vg_i=V_cell_initial), hence good voltage gain; and
(2) The remaining charge stored in the gated diode that are more than needed for nominal charge transfer operation serves as design margin for separating the stored 1-data from 0-data, for cell retention reliability against source_drain leakage, gate tunneling leakage, and soft error due to radiation ("SER").

For the 2T1D case, under constrained charge transfer, Constrained charge transfer: (Vg_f>Vs+Vt_gd)

$$Q\_transfer1=(Vs+Vt\_gd-Vt\_rg)Cg\_rg$$

(charging up Cg_rg, up to Vs+Vt_gd)

$$Q\_transfer2=Q\_stored-Q\_transfer1$$

(charging up Cg_gd+Cg_rg, above Vs+Vt_gd)

$$=(Vg\_i-Vt\_gd)Cg\_gd-(Vs+Vt\_gd-Vt\_rg)Cg\_rg$$

$$=Vg\_i \ Cg\_gd-Vs \ Cg\_rg+Vt\_rg \ Cg\_rg-Vt\_gd \ (Cg\_gd+Cg\_rg) \quad (5a)$$

$$del\_V1=Vs+Vt\_gd-Vt\_rg$$

$$del\_V2=Q\_transfer2/(Cg\_gd+Cg\_rg)$$

$$=[(Vg\_i-Vt\_gd)Cg\_gd-(Vs+Vt\_gd-Vt\_rg)Cg\_rg]/(Cg\_gd+Cg\_rg)$$

$$=Vg\_i \ Rc/(1+Rc)-Vs/(1+Rc)+Vt\_rg/(1+Rc)-Vt\_gd$$

$$Vg\_f=Vt\_rg+del\_V1+del\_V2=(Vs+Vg\_i)Rc/(1+Rc)+Vt\_rg/(1+Rc) \quad (5b)$$

$$Gain=Vg\_f/Vg\_i \sim (1+Vs/Vg\_i)Rc/(1+Rc) \quad (5c)$$

(Vt_gd<Vg_i, Rc>>1)

To summarize,

Gain=1+Rc−(Vt_gd/Vg_i) Rc~1+Rc complete charge transfer (for small Rc).

Gain=(1+Vs/Vg_i) Rc/(1+Rc) constrained charge transfer (large Rc).

Using the above example, $$Vg\_i=0.4 \ V,$$

$$Vs=1 \ V,$$

$$Vt\_gd=0,$$

$$Vt\_rg=0.6 \ V$$

$$Vg\_f=(1+0.4)(10)/(1+10)+0.6/(1+10)=1.33 \ V$$

$$Gain=1.33/0.4=3.3$$

TABLE 2

Gain as a function of Rc, Vs, Vg_i

| | Rc = Cg_gd/Cg_rg | | | | | | |
|---|---|---|---|---|---|---|---|
| | 0.01 | 0.1 | 1 | 2 | 5 | 10 | 100 |
| 1 + Rc | 1.01 | 1.1 | 2 | 3 | 6 | 11 | 101 |
| Rc/(1 + Rc) | 0.01 | 0.09 | 0.5 | 0.67 | 0.83 | 0.91 | 0.99 |
| Gain (Vs/Vg = 2.5) | 0.035 | 0.32 | 1.75 | 2.35 | 2.91 | 3.19 | 3.47 |
| Gain (Vs/Vg = 3) | 0.04 | 0.36 | 2.00 | 2.68 | 3.32 | 3.64 | 3.96 |
| Charge Transfer | complete | | | constrained | | | |

The gated diode storage cell enables the complete and/or partial charge transfer from the storage cell to the corresponding bitline and sensing circuit (instead of only charge sharing in conventional case) to achieve a much larger signal during a Read operation compared to both conventional 1T1C, 2T1C and 3T1C DRAM cells. Indeed it even achieves voltage gain compared to the initial stored cell voltage for both the 1T1D and 2T1D cases, whereas there is no voltage gain in the conventional cases. In the case of 2T1D, "double gain" are achieved in both the storage cell (voltage gain) and the sensing read device (current gain), compared to only single gain (obtained from the read device) as described in 2T1C or 3T1C memory cells.

Circuit, Read and Write Operations of 2T1D Memory Cell are now considered. FIG. 1A shows a schematic of a 1T1D gated diode memory cell and its operation. FIGS. 1B, 2B and 2C show schematics of gated diode memory cells and illustrate operation in 2T1D memory cells. As shown in FIG. 2C, there are two wordlines, one for Write (WLw) and one for Read (WLr) going into each memory cell. There are also two bitlines, one for Write (BLw) and one for Read (BLr) going into the same cell. With separate bitline for Read and Write, it is a dual port Read/Write memory cell. As shown in FIG. 1B, the two bitlines can be combined into a single bitline, resulting in a single port memory cell. The two-port memory cell requires more wiring area, but a set of memory cells in one wordline and another set of memory cells in another wordline can be read and written at the same time, hence doubling the maximum memory read and write data throughput. Whereas for the single port memory cell, the Read and Write operations have to be completely separated, resulting in smaller read and write data throughput. There is no difference in the gate diode principle of operation in both cases.

The Read/Write operations of the gated diode have been described. In the context of this 2T1D memory cell, for Write operation, the wordline WLw is raised from Low to High (VWLH) so the 0-data or 1-data (VBLH) on the bitline can be written into the gate of the gated diode via the write device (whose gate is connected to WLw). Typically, VWLH=1-1.2 V, VBLH=0.4 V, Vt_writedevice=0.5 V (or smaller). Small wordline voltage is enough to drive this kind of memory cell, resulted in very area-efficient wordline drivers compared to the large, boosted wordline drivers in conventional DRAM. A negative voltage can be applied to the wordlines that are not selected to minimize the sub-threshold leakage of the connecting write devices in those rows.

For Read operation, the wordline WLr is raised from Low (GND) to High (VWLH). When 0-data is stored in the memory cell, there is zero or very little charge stored in the gated diode, and the capacitance across the gated diode (Cg_gd(OFF)) is very small. When WLr is raised, there is only a very slight increase in voltage at the storage node (gate of the gated diode) because the coupling effect is very small. The 0-data coupling effect comes from the voltage divider formed by the OFF gated diode capacitance (Cg_gd(OFF)), being order of magnitude smaller, and the load capacitance (C_load) of the connecting nodes to the gate of the gated diode, the load capacitance part being bigger, say typically 10 to 1. So the voltage increase at the storage node for 0-data Read is very small, of the order of VWLH/10 (about 100 mV). When 1-data (VBLH) is stored in the memory cell, there is lots of charge (Q_stored) stored in the ON gated diode and the capacitance (Cg_gd(ON)) across the gated diode is large. When WLr is raised, so is the source voltage (Vs) of the gate diode, the voltage (Vg) at the storage node is boosted to $$Vg\_f = Vs \cdot cc + Vg\_i \quad (2a)$$

$$cc = Cg\_gd/(Cg\_gd + C\_load) \quad (2b)$$

where cc is the coupling coefficient of the voltage divider formed by the gated diode gate to source capacitance (Cg_gd) and the combined load capacitance (C_load) of the connecting nodes to the gate of the gated diode, Vg_i is the initial voltage Vg at the gate of the gated diode (storage node) and Vg_f is the voltage Vg after the voltage of WLr is raised.

Two exemplary embodiment implementations of a 2T1D Memory Cell are now considered.

In the first exemplary embodiment, a planar implementation of gated diode is described. The gated diode memory cell can be implemented in the form of a "partial" FET with connections to only the gate and the source. The gated diode can be considered as a "partial" field-effect transistor in a conventional FET setting, with the drain of the FET left open. Another possible planar implementation is with the drain connected to the source also, functioning as two "partial" field-effect transistors connected in parallel, or two gated diodes connected in parallel. The parallel gated diodes are used interchangeably as a gate diode.

Figures 1, 4:
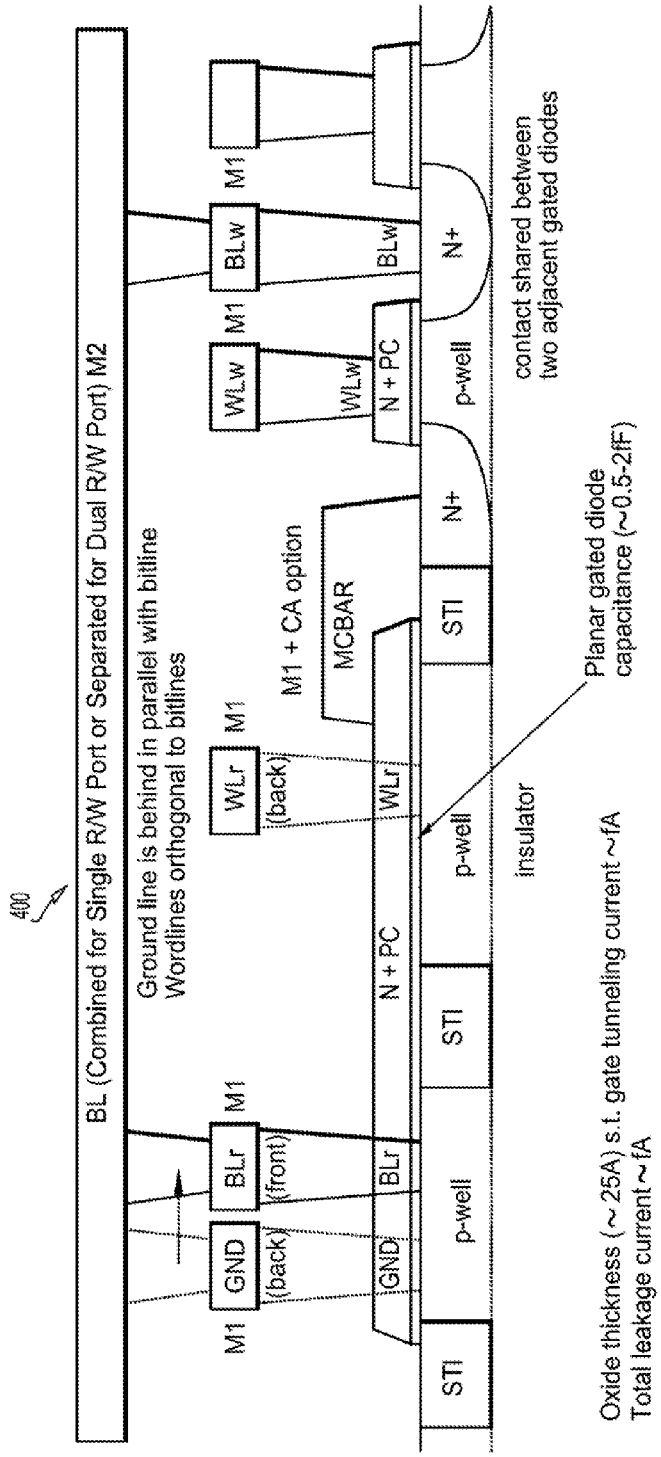
Figures 2, 4:
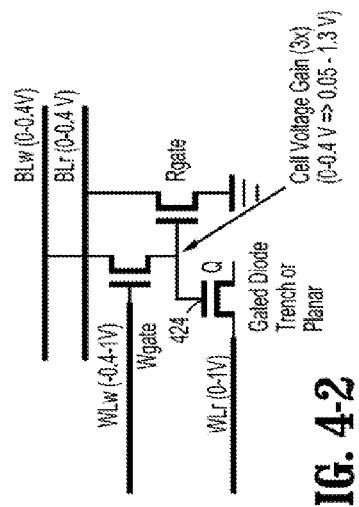
Figures 1, 5:
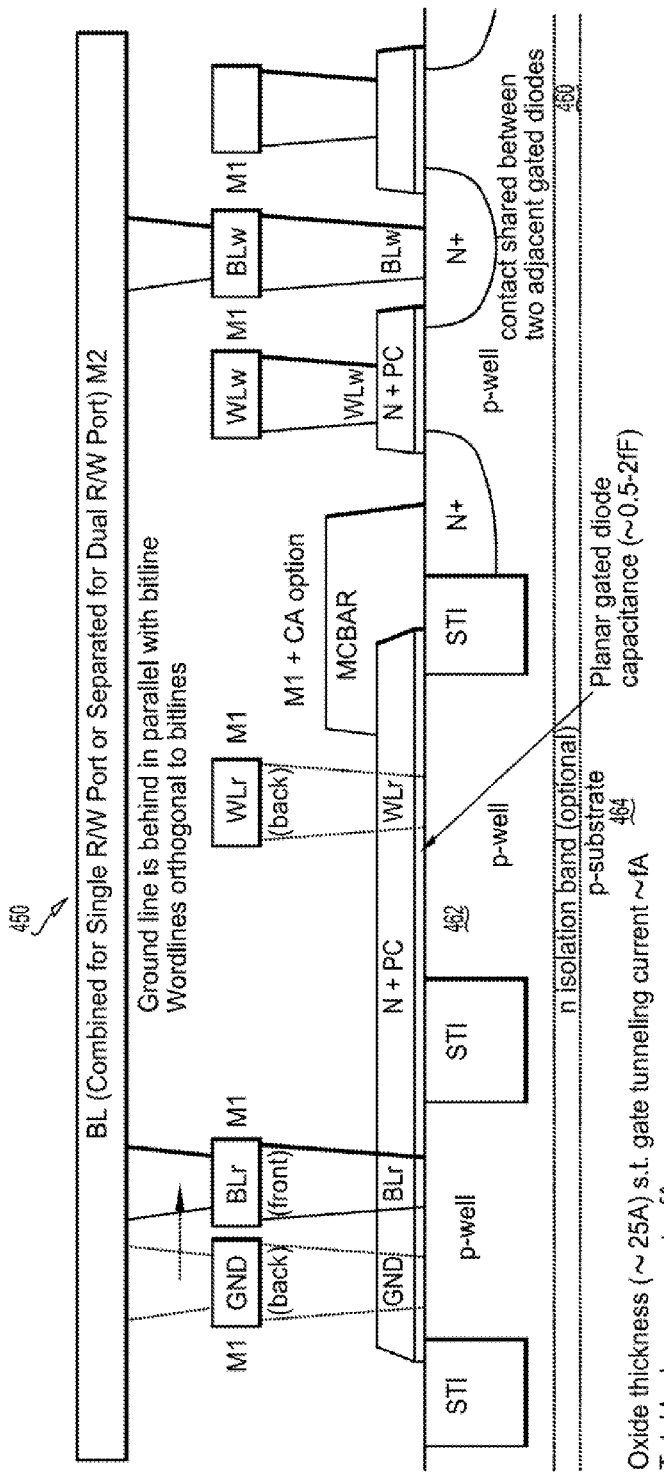
Figures 2, 5:
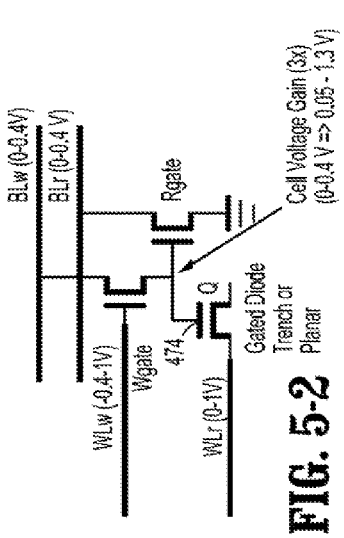

The gate is the storage node and the source is the node connecting to the wordline for Read, as shown in FIG. 2C. The gated diode FET can be implemented using planar bulk silicon or planar silicon in insulator (SOI) technology, with the gate above the diffusion area, as shown in FIG. 4. The gate area has to be large enough to provide sufficient capacitance (Cg_gd) relative to the total load capacitance (C_load) connected to the gate of the gated diode, when a 1-data is stored, to satisfy the typical operational point of:

$$Cg\_gd(OFF) : C\_load : Cg\_gd(ON) = 1 : 10 : 100$$

and $$Rc = Cg\_gd/Cg\_rg \sim Cg\_gd/C\_load(Cg\_gd \sim C\_load)$$
$$= 1 \sim 10$$

The threshold voltage of the read device (Vt_rg) and the write device (Vt_wg) should be chosen such that:

$$Vt\_rg > VBLH + off\_rg$$

(off_rg is design margin to ensure the total off-current of all read devices connected to a bitline is below certain level) and $$VWLH - Vt\_wg > VBLH + od\_wg$$

(od_wg is design margin to ensure enough gate overdrive (gate voltage minus threshold voltage) in the write devices for writing 1-data)

For VWLH=1.2 V, VBLH=0.4 V, off_rg=od_wg=0.2 V, we obtain that Vt_rg>0.6 V and Vt_wg<0.6 V. So high Vt FET devices are typically used for the read device and write device. Also thick oxide devices, typically 25 A thickness, are used to reduce gate tunneling leakage current.

For the planar gated diode, as described earlier, zero or very small threshold voltage device is preferred so that Vt_gd~0, to enhance 1-data voltage and gain.

Typically, but not limiting to these implementation numbers, the read device dimension can be chosen as 2:1 Lmin, where Lmin is the minimum feature size. 2:1 Lmin is chosen for small memory cell size.

So a typical size for the gate diode would be 4:4 Lmin, which is 8× in area and 8× in capacitance to that of the read device, i.e. Rc=Cg_gd/Cg_rg=8.

The second exemplary embodiment of a 2T1D Memory Cell is now considered. This embodiment is a trench implementation of gated diode. The gated diode can be implemented in the form of a shallow trench, with the gate formed by the cylindrical poly trench surrounded by thin oxide separated with the silicon underneath, as shown in FIGS. 3A and 3B. An area on the silicon surface next to the poly trench is positively doped to form the source diffusion of the gated diode, the poly trench is the gate. This implementation has the advantage that the area for the gated diode is smaller, and can produce bigger capacitance (Cg_gd) to operate in the deeply constrained charge transfer regime (Rc>10-100) for SER (soft error) protection. The cons are that this requires technology development on top of planar technology, and additional processing steps for embedded memory in regular planar silicon technology.

Top views of an exemplary layout of the cell are shown in FIG. 6 and FIG. 7. The bitlines are running vertically with M2 (second metal). The wordlines are running horizontally with M1 (first metal). FIG. 6 shows the layout of a single port memory cell. For a dual port Read/Write memory cell, one more bitline is added for separate Read and Write, such as in the exemplary layout 610 shown in FIG. 7.

A Gated Diode Memory Array, Wordline Driver, and Sensing Circuit are now considered. An array of gated diode memory cells can be formed by placing the cells in a two dimensional array, with Read/Write wordlines running horizontally, and Read/Write bitlines running vertically. The Read and Write bitlines can be separated as distinct bitlines, one for Read and one for Write for each column of cells-dual port Read/Write memory array, in which Read and Write operations can be performed simultaneously. The Read/Write bitlines can also be combined into a single bitline for each column of cells-single port Read/Write memory array, in which Read and Write operations have to be performed in distinct cycles.

Each horizontal Read or Write wordline drives many memory cells (typically 256-1024), and each bitline (Read/Write) runs vertically and connects to 128-256 cells typically. The horizontal wordlines and the vertical bitlines form a memory array. Since wordlines and bitlines are long wires, proper wordline drivers have to be designed to handle the wordline loading from the write devices on the write wordlines and the gate diodes on the read wordlines, and R, C delay of the wordlines. Further, proper design has to be incorporated to provide enough current to drive the bitlines during Read, Write operations to achieve timing objectives.

As shown, the operating points for operating the gated diode memory cell are extremely favorable for low voltage and low power operations. Typically, pertaining to the technology level that is being used, VWLH=1.0-1.2 V, VBLH=0.4 V for 1.0-1.2 V technology. The bitline and cell voltages are relatively small, about halved, compared to conventional DRAM and SRAM. Further, the wordline drivers and sense amplifiers to operate the gated diode memory array can be much simpler and smaller compared to conventional DRAM and SRAM. As a comparison, for the same level of silicon technology, typical voltages for DRAM/SRAM are VBLH=1V, VWLH=1.8 V. As a result, the gated diode memory can operate at about 50% voltage, hence substantial power saving can be achieved.

Due to the intrinsic voltage boosting and gain of the memory cell, the wordline voltage is relatively small (VWLH=1.0-1.2 V) compared to 1.8 V used in conventional DRAM/SRAM for the same level of technology, so no external wordline boosting is necessary. As a result, wordline drivers can be much simpler, without the need for a level shifter as used in most conventional DRAM's, hence the area for wordline drivers can be much smaller and array area efficiency can be much improved.

The bitline voltage is operating between 0 and VBLH (typically 0.4 V for 1-V silicon technology), so a regular driver can be used to drive the bitlines between 0 and VBLH during a Write operation. During a Read operation, the bitlines are precharged to VBLH, and the bitline signals are between 0 and VBLH, dropping to 0 for reading 1-data and holding at VBLH for reading 0-data. A small signal, high gain single ended sense amplifier can be used to detect the bitline signal.

Exemplary circuit simulations are now considered. Operation of the gated diode memory cell has been simulated electrically in the context of a memory array. Each horizontal Read or Write wordline drives many memory cells (typically 256-1024), and each bitline (Read/Write) runs vertically and connects to 128-256 cells, typically. The horizontal wordlines and the vertical bitlines form a memory array. Since wordlines and bitlines are long wires, so proper R, C loading and drivers have to be incorporated into the simulation to reflect proper physical operating conditions.

The resulting simulation waveforms of Write 1, Read 1, Write 0, Read 0, . . . are shown in FIG. 8.

The simulation condition for the waveforms shown in FIG. 8 is:

VBLH=0.4 V

VWLW=0~1.0 V, VWLR=0~1.0 V

Vcell=0.0~0.4 V (store), 0.05~1.3V (read)

gated diode cell: 0.6 u×1.5 u, zero Vt (trench)

read device: 0.28 u×0.12 u

BLcap~160 fF (256-cell bitline)

R,W NFET: Vt=0.6 V

Rc=Cg_gd/Cg_rg=27

Gain=1.25/0.4=3.1

The simulation condition for the waveforms shown in FIG. 13 is:

VBLH=0.65 V

VWLW=−b 0.4~1.2 V, VWLR=0~1.2 V

Vcell=0.0~0.6 V (store), 0.05~1.35V (read)

gated diode cell: 0.72 u×0.35 u, zero Vt (planar)

read device: 0.28 u×0.12 u, write_gate: 0.28 u×0.16 u

BLcap~160 fF (256-cell bitline)

R,W NFET: Vt=0.6 V

Rc=Cg_gd/Cg_rg=7.5

Gain=1.30/0.6=2.1

A Comparison is now made of a Gated Diode Memory Cell and a Conventional Memory Cell. In the case of a conventional 1T1C DRAM (110 of FIG. 1A), during a Read operation, instead of the charge in the memory cell being shared with the BL (or equalized with or discharged to the BL), the entire charge is transferred to the BL, as a result the steady state sensing bitline voltage V_bl_final in a Read operation is:

V_bl_final(1)=V_cell(1)C_cell/C_bl=VBLH C_cell/C_bl

Its value is higher than that in the case of conventional 1T1C DRAM, by a ratio of (1+C_cell/C_bl).

In the case that C_cell>C_bl, the steady state sensing bitline voltage V_bl_final would be higher than the initial stored cell voltage V_cell(1) or VBLH.

The following table summarizes the cell voltage gain and sensing signal advantages of gated diode memory cell:

TABLE 4

Cell Voltage Gain and Sensing Signal Advantages of a 1T1D Embodiment

| | Gated Diode 1T1D Cell | 1T1C DRAM Cell |
|---|---|---|
| V_cell_initial(0, 1) | 0~VBLH | 0~VBLH |
| V_bl_final(0, 1) | 0~VBLH C_cell/C_bl | 0~VBLH C_cell/(C_cell + C_bl) |
| C_cell/C_bl = 0.25 | 0.25 VBLH | 0.2 VBLH (transfer ratio = 0.2) |
| C_cell/C_bl = 1 | VBLH | 0.5 VBLH (transfer ratio = 0.5) |
| C_cell > C_bl | >VBLH | <VBLH |
| Signal Improved | 1 + C_cell/C_bl (better than 1T1C) | 1 |
| Gain = dVf/dVi dVf = V_cell_final(0-1) dVi = V_cell_initial(0-1) | C_cell/C_bl (can be > 1) | C_cell/(C_cell + C_bl) (always < 1) |

In the case of 2T1D DRAM (120 of FIG. 1B), during a Read operation, instead of the charge in the memory cell remains there to hold the voltage constant at V_cell(1) to drive the read device, the entire charge Q_cell is transferred to the gate of the read device. The charge stored in the memory cell for 1-data is Q_cell(1)=V_cell(1) C_cell and is transfer to the gate of the read device, under complete charge transfer mode of operation, which gets a voltage increase of:

del_V_rg=Q_cell(1)/C_rg=V_cell(1)C_cell/C_rg

The steady state sensing voltage at the gate of the read device in a Read operation is:

V_rg_final(1)=V_cell_final(1)=V_cell(1)(1+C_cell/C_rg)

Its value is always greater than 1, meaning there is always a voltage increase than the initial value regardless of the value of C_cell and C_rg, hence giving more sensing signal and read speed.

The following table summaries the cell voltage gain and sensing signal advantages of gated diode memory cell:

TABLE 5

Cell Voltage Gain and Sensing Signal Advantages of a 2T1D Embodiment

| | Gated Diode 2T1D Cell | 2T1C DRAM Cell |
|---|---|---|
| V_cell_initial(0, 1) | 0~VBLH | 0~VBLH |
| V_cell_final(0, 1) | 0~VBLH(1 + C_cell/C_rg) (>VBLH) | 0~VBLH |
| Signal Improved. | 1 + C_cell/C_rg | 1 |
| Gain = dVf/dVi dVf = V_cell_final(0-1) dVi = V_cell_initial(0-1) | 1 + C_cell/C_rg (always > 1 for 2T1D) | 1 |

Although illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. All such changes and modifications are intended to be included within the scope and spirit of the present disclosure as set forth in the appended claims.

What is claimed is:

1. A gated diode memory cell, comprising:
at least one switching unit, including a first field effect transistor (FET) and a second FET; and
a directional unit, including a gated diode, the directional unit being in signal communication with the at least one switching unit,
wherein a source of the first FET is in signal communication with a gate of the gated diode,
wherein a gate of the first FET is electrically connected to a write wordline of the gated diode memory cell, and
wherein the first FET and the second FET comprise respective drain terminals electrically connected to a bitline of the gated diode memory cell,
wherein the gate of the gated diode forms one terminal of a storage cell of the gated diode memory cell and a source of the gated diode forms another terminal of the storage cell of the gated diode memory cell, and
wherein none of the switching units of the gated diode memory cell are directly connected to a read wordline of the gated diode memory cell.

2. The gated diode memory cell of claim 1, wherein the source of the first FET is in signal communication with a source of the second FET.

3. The gated diode memory cell of claim 1, wherein the gate of the gated diode is in signal communication with the source of the first FET.

4. The gated diode memory cell of claim 1, wherein a gate of the first FET is in signal communication with the write wordline.

5. The gate diode memory cell of claim 1, wherein a second terminal of the gated diode is in signal communication with a read wordline.

6. The gate diode memory cell of claim 1, wherein a third terminal of the gated diode is left open.

7. The gate diode memory cell of claim 1, wherein a third terminal of the gated diode is in signal communication with a second terminal of the gated diode.

8. The gate diode memory cell of claim 1, wherein the gate diode memory cell is configured to:
write 1-data to the gate of the gated diode as a high voltage by storing a charge corresponding to the 1-data in an inversion layer between the gate of the gated diode and a channel of the gated diode; and
0-data to the gate of the gated diode as a low or zero voltage by storing substantially no charge corresponding to the 0-data in the inversion layer.

9. The gate diode memory cell of claim 1, wherein a memory cell voltage of the gate diode memory cell has a voltage gain during a read operation.

10. The gate diode memory cell of claim 1, wherein the first FET and the second FET are in signal communication with a write bitline and a read bitline, respectively.

11. The gate diode memory cell of claim 1, wherein the first FET is a write device and the second FET is a read device.

12. The gate diode memory cell of claim 1, wherein a source terminal of the second FET is electrically connected to ground.

13. The gate diode memory cell of claim 1, wherein the gate of the gated diode is a storage node.

14. The gated diode memory cell of claim 1, wherein the second FET is directly connected to the bitline of the gated diode memory cell and is not directly connected to the gated diode.

15. The gated diode memory cell of claim 1, wherein the second FET is at the same time directly connected to the bitline of the gated diode memory cell and also directly connected to ground.

16. The gated diode memory cell of claim 1, wherein the gated diode is a trench FET.

17. The gated diode memory cell of claim 1, wherein the gated diode is a planar FET.

\* \* \* \* \*